United States Patent
Asai et al.

(10) Patent No.: US 6,223,425 B1
(45) Date of Patent: May 1, 2001

(54) CIRCUIT-COMPONENT SUPPLYING SYSTEM

(75) Inventors: Koichi Asai, Nagoya; Tomohiko Hattori, Kariya, both of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/200,976

(22) Filed: Nov. 30, 1998

(30) Foreign Application Priority Data

Dec. 18, 1997 (JP) .................................................. 9-349404

(51) Int. Cl.[7] .................................................. H05K 3/30
(52) U.S. Cl. .................................. 29/740; 29/743; 29/832
(58) Field of Search ............................ 29/740, 739, 741, 29/743, 832

(56) References Cited

U.S. PATENT DOCUMENTS

| | | | |
|---|---|---|---|
| 4,951,383 | * | 8/1990 | Amao et al. .......................... 29/740 X |
| 5,784,777 | | 7/1998 | Asai et al. . |

FOREIGN PATENT DOCUMENTS

| | | |
|---|---|---|
| 2-57719 B2 | 12/1990 | (JP) . |
| 4-345097 | 12/1992 | (JP) . |
| 6-296092 | 10/1994 | (JP) . |

* cited by examiner

Primary Examiner—Lee Young
Assistant Examiner—Rick Kiltae Chang
(74) Attorney, Agent, or Firm—Oliff & Berridge, PLC

(57) ABSTRACT

A circuit-component supplying system including a supplying device which stores a plurality of circuit components in a first storing manner and stores a plurality of circuit-component holders in a second storing manner substantially identical with the first storing manner, and which supplies the circuit components in a first supplying manner and supplies the circuit-component holders in a second supplying manner substantially identical with the first supplying manner, a movable member to which one of the circuit-component holders is detachably attachable, and a movable-member moving device which moves, in a first moving manner, the movable member so that the movable member receives the one circuit-component holder from the supplying device, and which moves, in a second moving manner substantially identical with the first moving manner, a holding head including the movable member and the one circuit-component holder held by the movable member, so that the one circuit-component holder receives one of the circuit components from the supplying device and holds the one circuit component.

18 Claims, 16 Drawing Sheets

CIRCUIT-COMPONENT SUPPLYING SYSTEM

BACKGROUND OF THE INVENTION

1. Field of the Invention

The present invention relates to a system and a method for supplying a plurality of circuit components, one by one.

2. Related Art Statement

The above-indicated sort of circuit-component supplying system and method are widely used for, e.g., mounting circuit components on a circuit substrate, such as a printed circuit board, and thereby producing an electric circuit (e.g., an electronic circuit). The circuit-component supplying system includes a supplying device which stores the circuit components and supplies the components, one by one; a holding head which holds a circuit component; a head moving device which moves the holding head so that the head receives a circuit component from the supplying device and holds the component. The holding head includes a movable member which is moved by the head moving device; and a component holder which is held by the movable member. Meanwhile, there are various sorts of circuit components which have various shapes and sizes. Thus, it is difficult for a single sort of holding head to hold all the sorts of circuit components to be mounted on the circuit substrate. To solve this problem, it has been practiced that a plurality of sorts of component holders are prepared, one of the holders which is suitable for each of the components is selected, and the selected holder is held by the movable member. In this way, a plurality of sorts of holding heads are prepared.

There is known a method in which one of the above-indicated component holders is automatically changed with another holder. In this known method, however, the components holders are stored in, and supplied from, a holder supplying device which is provided independent of a component supplying device which stores and supplies the circuit components. Thus, the known method needs both the component supplying device and the holder supplying device, and a circuit-component supplying system for carrying out the method suffers from a complex construction and a high production cost. In the case where circuit components of one sort that needs the use of a first sort of component holder are supplied and then circuit components of another sort that needs the use of a second sort of component holder are supplied, the changing of the two holders requires the movable member to be moved in a manner different from the manner in which the movable member is moved for the first sort of component holder to receive and hold each of the circuit components of one sort. This leads to lowering the efficiency of the circuit-component supplying operation as a whole that includes the component-holder changing operation.

SUMMARY OF THE INVENTION

It is therefore an object of the present invention to provide a circuit-component supplying system which enjoys a simple construction and a low production cost and which performs, with improved efficiency, a circuit-component supplying operation including a component-holder changing operation.

It is another object of the present invention to provide a circuit-component mounting system which includes a circuit-component supplying system and which enjoys the same advantages as those indicated above.

It is another object of the present invention to provide a circuit-component supplying method which enjoys improved efficiency.

It is another object of the present invention to provide a recording medium for recording a control program or programs which is or are needed to control a circuit-component supplying system.

The present invention provides an electric-component supplying system, an electric-component mounting system, an electric-component supplying method, and a recording medium which have one or more of the technical features that are described below in respective paragraphs given parenthesized sequential numbers (1) to (16). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following features and the appropriate combinations thereof are just examples, and the present invention is by no means limited thereto.

(1) According to a first feature of the invention, there is provided a circuit-component supplying system comprising a supplying device which stores a plurality of circuit components in a first storing manner and stores a plurality of circuit-component holders in a second storing manner substantially identical with the first storing manner, and which supplies the circuit components in a first supplying manner and supplies the circuit-component holders in a second supplying manner substantially identical with the first supplying manner; at least one movable member to which one of the circuit-component holders is detachably attachable; and a movable-member moving device which moves, in a first moving manner, the movable member so that the movable member receives the one circuit-component holder from the supplying device, and which moves, in a second moving manner substantially identical with the first moving manner, a holding head including the movable member and the one circuit-component holder held by the movable member, so that the one circuit-component holder receives one of the circuit components from the supplying device and holds the one circuit component.

(2) According to a second feature of the invention that includes the first feature (1), the one circuit-component holder comprises a suction pipe which sucks and holds the one circuit component by applying a negative air pressure to the one circuit component; and an attachable portion which is detachably attachable to the movable member.

(3) According to a third feature of the invention that includes the first or second feature (1) or (2), the supplying device comprises a plurality of trays which cooperate with each other to store each of the circuit components and the circuit-component holders at a corresponding one of a plurality of predetermined storage positions. It is preferred that the supplying device comprise a tray accommodating member and a tray moving device according to the fourth feature (4) described below, because the supplying device enjoys a compact construction and the holding head can quickly receive a circuit component and a component holder. However, the supply device is not essentially required to employ the fourth feature (4). For example, the supplying device may be one which includes a plurality of trays which are arranged on a common plane, or one which includes a plurality of trays which are accommodated in a tray accommodating member such that the trays are superposed over each other with a space being left between each pair of vertically adjacent trays. In the last case, the holding head may enter the space to receive a desired circuit component or a desired component holder.

(4) According to a fourth feature of the invention that includes the third feature (3), the supplying device further comprises a tray accommodating member which accommodates the trays in such a manner that the trays are superposed over each other; and a tray moving device which selectively moves one of the trays relative to the tray accommodating member in such a manner that the one tray is positioned at a predetermined supply position thereof. The tray moving device may be a tray drawing device which draws each of the trays by engaging a front portion of the each tray, or a tray pushing device which pushes each of the trays by engaging a rear portion of the each tray. The tray accommodating member may be a box-like member or a frame-like member.

(5) According to a fifth feature of the invention that includes the fourth feature (4), the supplying device further comprises a tray elevating and lowering device which elevates and lowers the tray accommodating member in such a manner that the one tray is positioned at a predetermined height position. This tray elevating and lowering device may be employed in the above-described case where the trays are accommodated in the tray accommodating member such that the trays are superposed over each other with a space being left between each pair of vertically adjacent trays and the holding head enters the space to receive a desired circuit component or a desired component holder.

(6) According to a sixth feature of the invention that includes the first or second feature (1) or (2), the supplying device comprises a plurality of component feeders each of which stores a plurality of circuit components of one sort and supplies the circuit components, one by one, from a component-supply portion thereof; a support table which supports the component feeders in such a manner that the respective component-supply portions of the feeders are arranged along a reference line; a plurality of holder feeders each of which stores a plurality of circuit-component holders in a holder-store portion thereof corresponding to the respective component-supply portions of the component feeders and which are supported by the support table in such a manner that the respective holder-store portions of the holder feeders are aligned with the component-supply portions of the component feeders along the reference line; and a table displacing device which displaces the support table in a direction parallel to the reference line and selectively positions one of the component-supply portions of the component feeders and the holder-store portions of the holder feeders, at a predetermined supply position.

(7) According to a seventh feature of the invention that includes the sixth feature (6), the support table comprises a rotatable table which is rotatable about an axis line intersecting a horizontal plane, and wherein the table displacing device comprises a table rotating device which rotates the rotatable table about the axis line.

(8) According to an eighth feature of the invention that includes the sixth feature (6), the support table comprises a linearly movable table which is linearly movable along a horizontal, straight line, and wherein the table displacing device comprises a linearly moving device which linearly moves the linearly movable table along the straight line.

(9) According to a ninth feature of the inventions there is provided a circuit-component mounting system comprising a circuit-component supplying system according to any one of the first to eighth features (1) to (8); and a circuit-substrate holding device which holds a circuit substrate on which the circuit components are to be mounted, the movable-member moving device moving the holding head including the movable member and the one circuit-component holder so that the one circuit-component holder mounts the one circuit component received from the supplying device, on the circuit substrate held by the circuit-substrate holding device.

(10) According to a tenth feature of the invention that includes the ninth feature (9), the movable-member moving device comprises an X-Y robot which moves the movable member to an arbitrary position on a substantially horizontal plane.

(11) According to an eleventh feature of the invention that includes the ninth feature (9), the movable-member moving device comprises a rotating device which rotates the movable member about an axis line intersecting a horizontal plane, and stops the movable member at at least one predetermined stop position.

(12) According to a twelfth feature of the invention that includes the eleventh feature (11), the system comprises a plurality of movable members as the at least one movable member, and wherein the rotating device comprises a plurality of rotary members which are rotatable about the axis line, independent of each other, and which support the plurality of movable members, respectively, at respective equal distances from the axis line; and a drive device which rotates the rotary members about the axis line independent of each other and stops each of the rotary members at the predetermined stop position.

(13) According to a thirteenth feature of the invention that includes the eleventh feature (11), the system comprises a plurality of movable members as the at least one movable member, and wherein the rotating device comprises a rotatable body which is rotatable about the axis line and which supports the plurality of movable members such that the movable members are located on a circle whose center rides on the axis line, and are angularly spaced from each other about the axis line at a predetermined angular pitch; and a drive device which intermittently rotates the rotatable body at the predetermined angular pitch and thereby stops the movable members, one by one, at the predetermined stop position.

(14) According to a fourteenth feature of the invention that includes any one of the ninth to thirteenth features (9) to (13), the circuit-substrate holding device comprises a circuit-substrate moving device which moves the circuit substrate in an X-axis direction and a Y-axis direction perpendicular to the X-axis direction in a substantially horizontal plane, and positions a certain portion of the circuit substrate at a predetermined component-mount position.

(15) According to a fifteenth feature of the invention, there is provided a circuit-component supplying method comprising the steps of supplying a plurality of circuit components in a first supplying manner, and supplying a plurality of circuit-component holders in a second supplying manner substantially identical with the first supplying manner; and moving, in a first moving manner, a movable member so that the movable member receives one of the circuit-component holders, and moving, in a second moving manner substantially identical with the first moving manner, a holding head including the movable member and the one circuit-component holder held by the movable member, so that the one circuit-component holder receives one of the circuit components and holds the one circuit component.

(16) According to a sixteenth feature of the invention, there is provided a recording medium readable by a computer, the medium recording at least one of a supply control program according to which the computer controls a supplying device to supply a plurality of circuit components in a first supplying manner and supply a plurality of circuit-component holders in a second supplying manner substantially identical with the first supplying manner, and a reception control program according to which the computer controls a movable-member moving device to move, in a first moving manner, a movable member so that the movable member receives one of the circuit-component holders from the supplying device, and move, in a second moving manner substantially identical with the first moving manner, a holding head including the movable member and the one circuit-component holder held by the movable member, so that the one circuit-component holder receives one of the circuit components from the supplying device and holds the one circuit component.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Referring to FIGS. 1 to 11, there will be described an electronic-component ("EC") mounting system 12 which mounts electronic components ("ECs") 32 as circuit components, on a printed circuit board ("PCB") 24 as a circuit substrate. The EC mounting system 12 embodies the EC mounting system of the present invention, and includes an EC supplying system 19 which embodies the EC mounting system of the present invention and which performs the EC mounting method of the invention. The EC mounting system 12 also includes a read only memory (ROM) 314 which embodies the recording medium of the invention.

Figure 1:
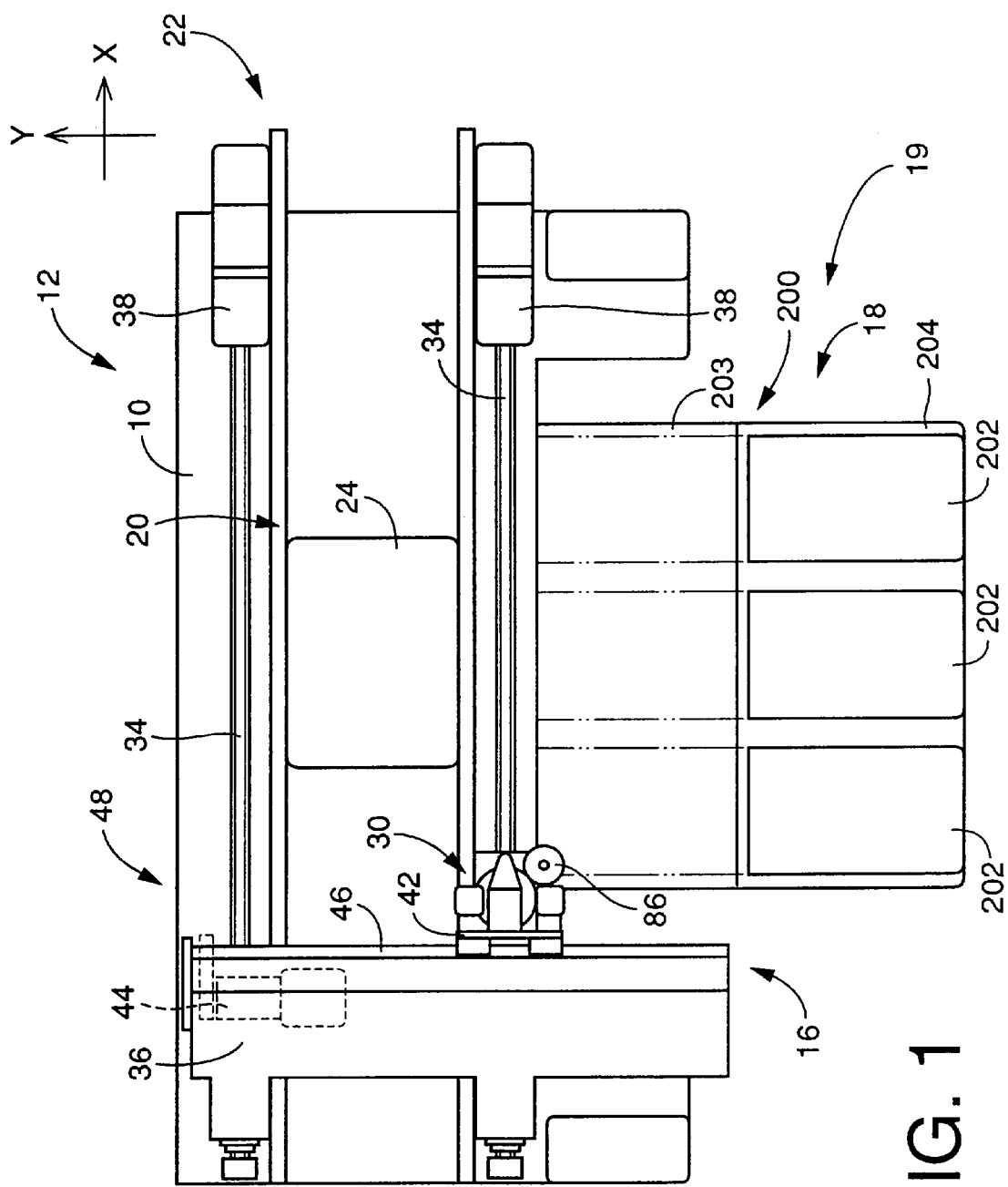
FIG. 1 is a plan view of an electronic-component ("EC") mounting system including an EC supplying system to which the present invention is applied.

In FIG. 1, reference numeral 10 denotes a base of the EC mounting system 12. On the base 10, there are provided an EC mounting device 16, the EC supplying system 19 including an EC-and-nozzle supplying device 18 (hereinafter, referred to as the "supplying device" 18), and a PCB holding device 20. The PCB holding device 20 includes a PCB conveyor 22 which extends in an X-axis direction indicated at arrow in FIG. 1 and which conveys the PCB 24. The PCB 24 is positioned and supported at a predetermined EC-mount position by a PCB positioning and supporting device (not shown). The supplying device 18 is provided on one side of the PCB conveyor 22 as seen in a Y-axis direction perpendicular to the X-axis direction in a horizontal plane. The supplying device 18 will be described later.

The EC mounting device 16 includes an EC holding head 30 which is linearly movable in each of the X-axis direction and the Y-axis direction to convey an EC 32 and mount the EC 32 on the PCB 24. To this end, two ball screws 34 which are parallel to each other are provided, on the base 10, on both sides of the PCB conveyor 22, respectively, as seen in the Y-axis direction. The two ball screws 34 are threadedly engaged with two first nuts (not shown), respectively, which are fixed to an X-axis slide 36. When the ball screws 34 are rotated in synchronism with each other by respective X-axis servomotors 38, the X-axis slide 36 is moved in the X-axis direction. On the base 10, there are provided two guide rails (not shown) as guide members, below the two ball screws 34, respectively. The X-axis slide 36 fits on the two guide rails via respective guide blocks (not shown) as guided members, such that the X-axis slide 36 is slideable or movable on the guide rails while the movement of the slide 36 is guided by the rails.

Figure 2:
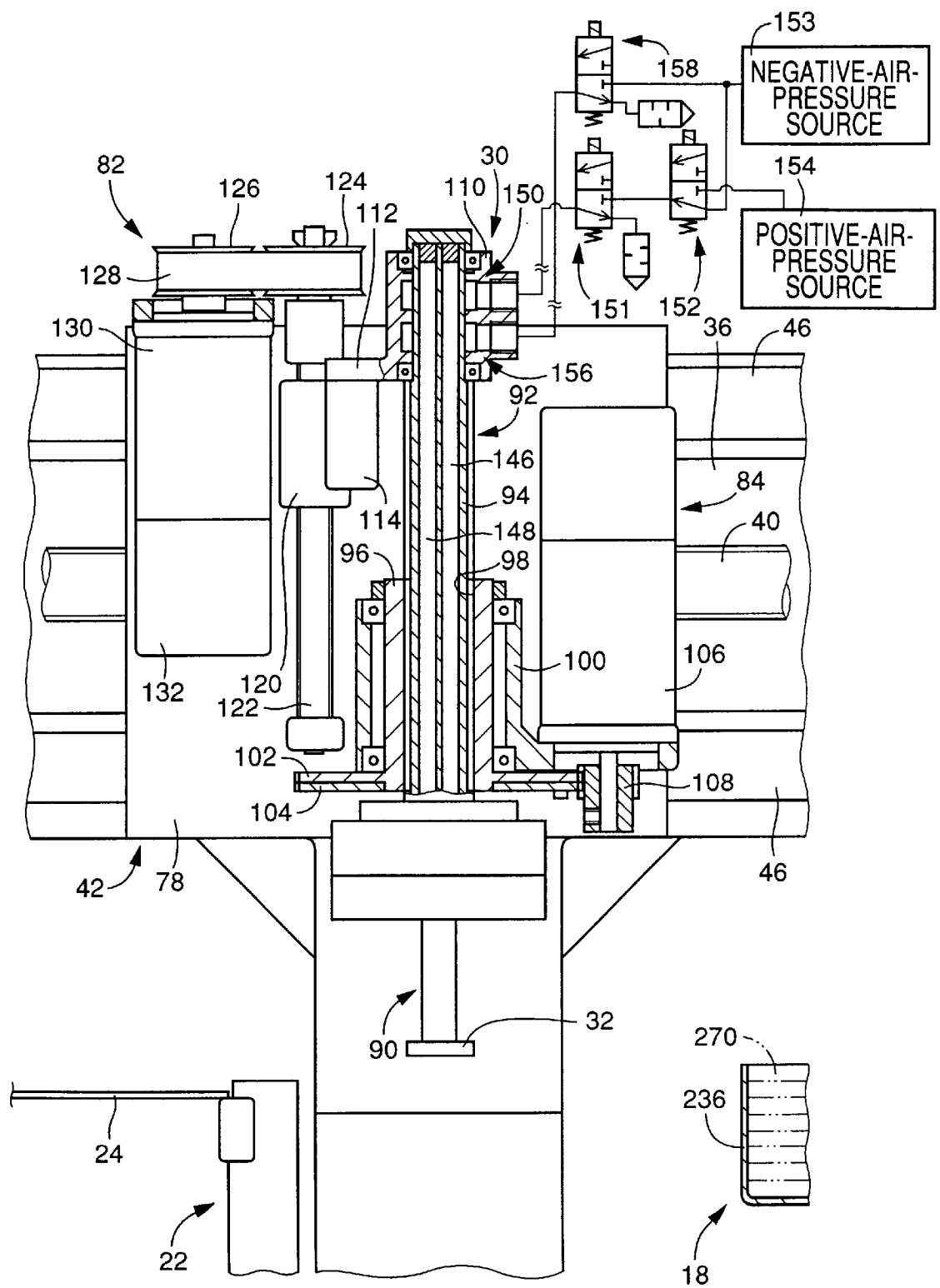
FIG. 2 is a partly cross-sectioned, front elevation view of an EC-holding head, an elevating and lowering device, and a rotating device of the EC mounting system of FIG. 1.

As shown in FIG. 2, on the X-axis slide 36, there is provided a ball screw 40 which extends in the Y-axis direction. A Y-axis slide 42 is threadedly engaged with the ball screw 40 via a second nut (not shown). When the ball screw 40 is rotated by a Y-axis servomotor 44 (FIG. 1), the Y-axis slide 42 is moved in the Y-axis direction while being guided by a pair of guide rails 46 as guide members.

The above-indicated base 10, the first nuts, the ball screws 34, the X-axis servomotors 38, the X-axis slide 36, the second nut, the ball screw 40, the Y-axis servomotor 44, and the Y-axis slide 42 cooperate with one another to provide an X-Y robot 48.

On the X-axis slide 36, there is provided a CCD (charge coupled device) camera 50 (FIG. 7) at a position below the Y-axis slide 42, and between the supplying device 18 and the PCB holding device 20 as seen in the Y-axis direction. The CCD camera 50 takes an image of the EC 32 held by the EC holding head 30. Since the CCD camera 50 is known in the art and is irrelevant to the present invention, no detailed description thereof is provided.

As shown in FIG. 2, the EC holding head 30 is attached to a vertical side surface 78 of the Y-axis slide 42, such that the head 30 is vertically movable and rotatable about a vertical axis line. The Y-axis slide 42 supports an elevating and lowering device 82 which elevates and lowers the EC holding head 30; a rotating device 84 which rotates the EC 32 held by the head 30, about a center line of the EC 32; and a CCD camera 86 (FIG. 1) which takes respective images of reference marks attached to the PCB 24.

The EC holding head 30 includes a suction nozzle 90 which sucks and holds an EC 32, and a nozzle holder 92 which holds the suction nozzle 90. The nozzle holder 92 is moved by the above-described X-Y robot 48. The EC mounting device 16 is capable of mounting various sorts of ECs having different shaped and dimensions, and can be used with various sorts of suction nozzles 90 corresponding to the different sizes of the ECs 32.

As shown in FIG. 2, the nozzle holder 92 includes a spline axis member 94 which fits in spline grooves 98 of a sleeve 96. The sleeve 96 is supported by an arm member 100 such that the sleeve 96 is rotatable and is immovable in an axial direction thereof. The arm member 100 is fixed to the side surface 78 of the Y-axis slide 42. A pair of wheels 102, 104 for removing backlash are provided on a lower end portion of the arm member 100 that projects downward from the arm member 100. The two wheels 102, 104 are meshed with a wheel 108 which is rotated by a rotating servomotor 106 of the rotating device 84. Thus, the spline axis member 94 is accurately rotated about its axis line, by the rotating servomotor 106, via the wheels 102, 104, 108 and the sleeve 96, so that the EC 32 held by the suction nozzle 90 is rotated.

To an upper end portion of the spline axis member 94, an engagement member 110 which is formed of a metal having a magnetism and an electric conductivity is attached such that the engagement member 110 is rotatable relative to the spline axis member 94 and is immovable in an axial direction thereof relative to the same 94. The engagement member 110 includes an engagement tongue 112 extend horizontally from a remaining portion thereof. The engagement tongue 112 is supported on a solenoid 114, which is attached to an elevator slide 120 as an elevator member of the elevating and lowering device 82. The suction nozzle 90 is supported on the elevator slide 120 via the solenoid 114 and the engagement member 110.

Figure 7:
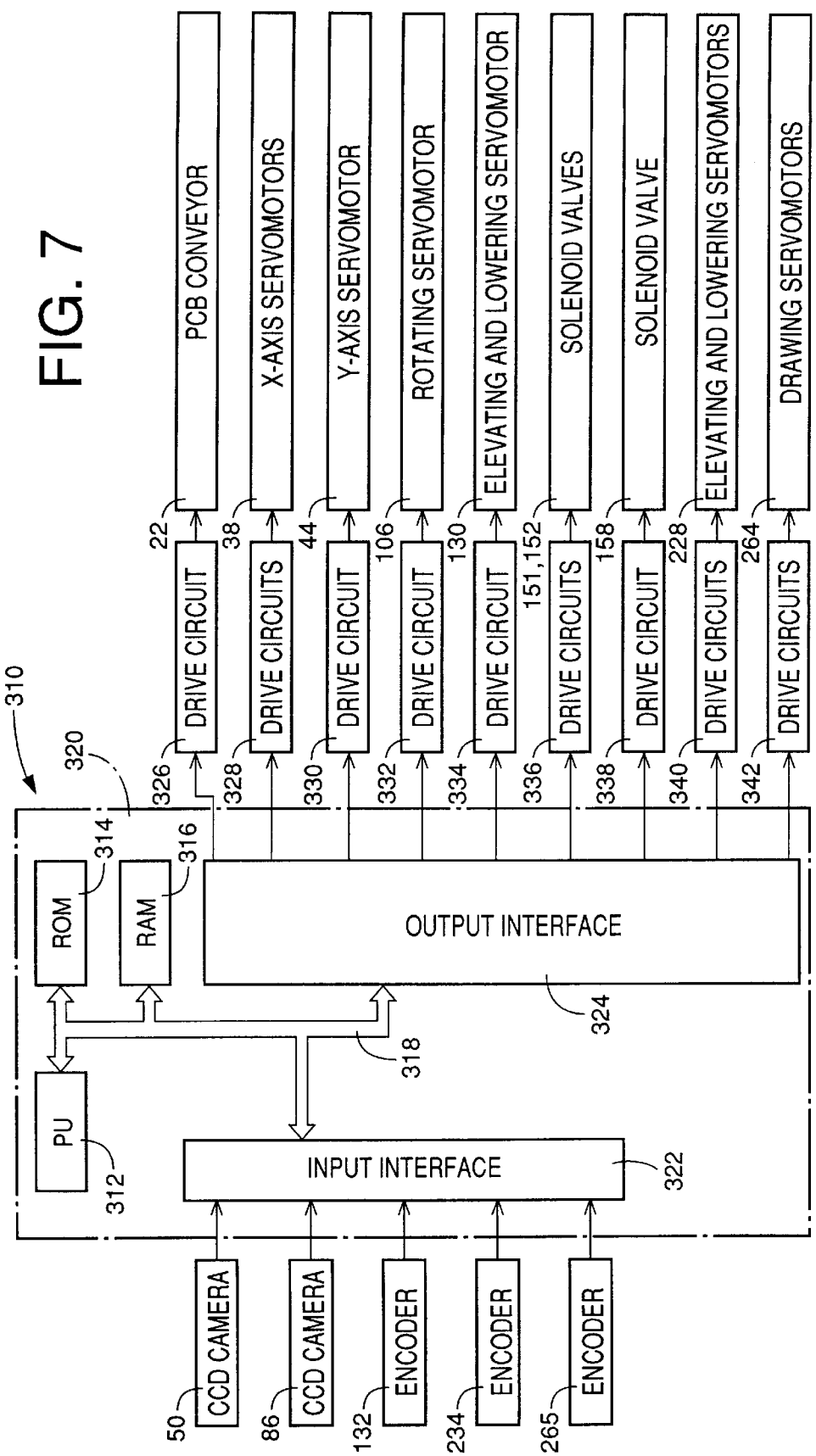
FIG. 7 is a diagrammatic view of a control device of the EC mounting system of FIG. 1.

The elevator slide 120 is threadedly engaged via a nut (not shown) with a vertical ball screw 122 which is attached to the side surface of the Y-axis slide 42. When the ball screw 122 is rotated by an elevating and lowering servomotor 130 via two pulleys 124, 126 and a belt 128, the elevator slide 120 is moved upward and downward and the suction nozzle 90 is moved upward and downward via the solenoid 114 and the engagement member 110. Since the suction nozzle 90 is supported on the elevator slide 120, the nozzle 90 follows the slide 120. That is, when the slide 120 is moved downward, the nozzle 90 is also moved downward; and when the slide 120 is moved upward, the nozzle 90 is forcedly moved upward. An amount of rotation of the elevating and lowering servomotor 130 is detected by an encoder 132, which is connected to a control device 310 (FIG. 7). Thus, the control device 310 obtains, from the encoder 132, information indicative of a distance of upward or downward movement of the slide 120 or the nozzle 90.

The solenoid 114 has a yoke around which a coil is wound. The yoke is attached to the elevator slide 120, in a state in which the yoke is electrically insulated from the slide 120 and an upper surface of the yoke is contacted with a lower surface of the engagement tongue 112 of the engagement member 110. Therefore, when an electric current is supplied to the coil to energize the yoke, the engagement member 110 is magnetically attracted by the yoke, so that the member 110 is fixed to the slide 120. Thus, the solenoid 114 provides an attracting device which produces an attractive force to attract the EC holding head 30 to the elevator slide 120.

The yoke of the solenoid 114 and the engagement member 110 are connected to respective electric-power sources. Therefore, in a state in which the yoke is contacted with the engagement member 110, an electric current flows between the yoke and the member 110; and in a state in which the yoke is separated from the member 110, no electric current flows between the yoke and the member 110.

Figure 3:
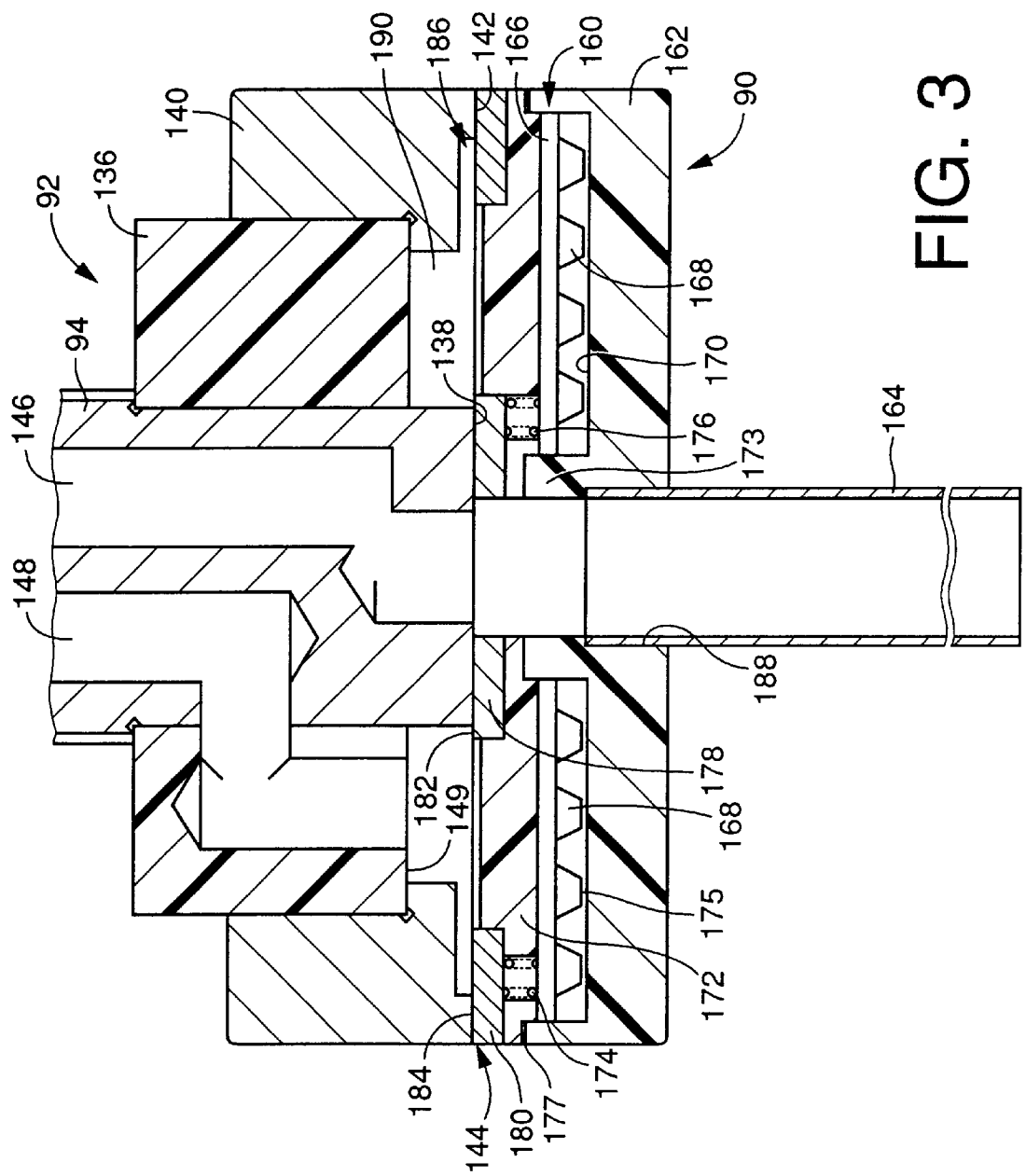
FIG. 3 is a cross-sectioned front view of the EC-holding head of FIG. 2.

As shown in FIG. 3, a ring member 136 which is formed of a resin is fixed to a lower end portion of the spline axis member 94 of the nozzle holder 92. The ring member 136 has a diameter greater than that of the spline axis member 94, and has a lower surface 149 higher than a lower surface 138 of the axis member 94. An attraction member 140 which is formed of a metal having a magnetism and an electric conductivity externally fits on the ring member 136. The attraction member 140 has a lower surface 142 flush with the lower surface 138 of the spline axis member 94. The two lower surfaces 138, 142 provide an attraction surface 144.

As shown in FIGS. 2 and 3, the spline axis member 94 has an EC suction passage 146 and a nozzle suction passage 148 which are formed through the member 94 to extend parallel to each other in an axial direction of the member 94. A lower end portion of the EC suction passage 146 is, as shown in FIG. 3, concentric with an axis line of the spline axis member 94, and opens in the lower surface 138 of the member 94. The nozzle suction passage 148 opens in the lower surface 149 of the ring member 136.

As shown in FIG. 2, the EC suction passage 146 is selectively communicated with one of a negative-air-pressure source 153, a positive-air-pressure source 154, and the atmosphere via a rotary coupling 150 formed integrally with the engagement member 110, a piping connected to the rotary coupling 150, and two solenoid-operated direction switch valves 151, 152 provided midway in the piping. The nozzle suction passage 148 is selectively communicated with one of the negative-air-pressure source 153 and the atmosphere via a rotary coupling 156 formed integrally with the engagement member 110, a piping connected to the rotary coupling 156, and a solenoid-operated direction switch valve 158 provided midway in the piping.

As shown in FIG. 3, the suction nozzle 90 includes a light emitter 160, a diffusion plate 162, and a suction pipe 164 as an EC-holding portion. The light emitter 160 includes an annular PCB 166 and a number of light emitting diodes ("LED") 168 attached to the annular PCB 166. The annular PCB 166 is fixed, at its radially inner portion, to a support plate 172 formed of a resin, but is not fixed, at its radially outer portion, to the support plate 172. Thus, the radially outer portion of the annular PCB 166 is contactable with, and separable from, the support plate 172.

The light emitter 160 supported by the support plate 172 fits on a central projection 173 projecting from an annular central portion of the diffusion plate 162, such that the light emitter 160 is accommodated in an annular recess 170 formed in the diffusion plate 162. Thus, the light emitter 160 is fixed to the diffusion plate 162. The support plate 172 also fits on the central projection 173 of the diffusion plate 162, and is fixed to the same 162. In a state in which the light emitter 160 and the support plate 172 are fixed to the diffusion plate 162, a small space 175 is left between the light emitting diodes 168 and a bottom surface of the annular recess 170, and a small space 177 is left between an outer peripheral portion of the support plate 172 and an upper surface of an outer peripheral wall of the diffusion plate 162. The outer peripheral wall of the diffusion plate 162 cooperates with the central projection 173 to define the annular recess 170.

Two annular plates 178, 180 which are concentric with each other and each of which is formed of a metal are fixed to an upper surface of the support plate 172. The inner annular plate 178 has a diameter slightly greater than that of the lower surface 138 of the spline axis member 94. The outer annular plate 180 has a diameter equal to that of the support plate 172. The two annular plates 178, 180 have respective upper surfaces 182, 184 which are flush with each other and are higher than the upper surface of the support plate 172. The two upper surfaces 182, 184 provide a closure surface 186 which is closely attractable to the attraction surface 144. The support plate 172 has a plurality of first holes (only one is shown in FIG. 3) which are formed through the thickness thereof in a direction parallel to the center line thereof and which correspond to a radially intermediate portion of the outer annular plate 180 fixed thereto, and a plurality of second holes (only one is shown in FIG. 3) which are formed through the thickness thereof in the direction parallel to the center line thereof and which correspond to an outer peripheral portion of the inner annular plate 178 fixed thereto. A first spring 174 is provided in each of the first holes such that one end portion of the first spring 174 is contacted with an electric circuit on the annular PCB 166 of the light emitter 160 and the other end portion of the same 174 is contacted with the outer annular plate 180. A second spring 176 is provided in each of the second holes such that one end portion of the second spring 176 is contacted with the electric circuit on the annular PCB 166 and the other end portion of the same 176 is contacted with the inner annular plate 178. The diffusion plate 162, the support plate 172, and the inner annular plate 178 have respective central holes which cooperate with one another to define a through-hole 188 in which the suction pipe 164 fits.

In a state in which the suction surface 144 and the closure surface 186 are contacted with each other, the suction pipe 164 communicates with the EC suction passage 146, and the nozzle suction passage 148 opens in a space 190 defined by the inner and outer annular plates 178, 180, the support plate 172, and the attraction member 140. If, in this state, a negative air pressure is supplied to the EC suction passage 146, the suction pipe 164 sucks and holds the EC 32; and if, in this state, a negative air pressure is supplied to the nozzle suction passage 148, the suction surface 144 sucks up the closure surface 186, so that the nozzle holder 92 sucks and holds the suction nozzle 90 owing to the negative pressure.

The attraction member 140 is connected via a lead wire and a switch (not shown) to a power source, and the spline axis member 94 is grounded. An anodic portion of the electric circuit of the annular PCB 166 is electrically connected to the outer annular plate 180 via the first springs 174, and a cathodic portion of the electric circuit of the annular PCB 166 is electrically connected to the inner annular plate 178 via the second springs 176. Therefore, in the state in which the suction nozzle 90 is sucked and held by the nozzle holder 92, an electric current is supplied to an electric circuit including the attraction member 140, the outer annular plate 180, the first springs 174, the LEDs 168, the second springs 176, the inner annular plate 178, and the spline axis member 94, so that the back surface of the EC 32 held by the suction pipe 164 is irradiated by a substantially uniform light emitted by the light emitter 160.

As described above, the inner peripheral portion of the light emitter 160 (i.e., the annular PCB 166) is fixed to the support plate 172, and the outer peripheral portion of the emitter 160 (i.e., the PCB 166) is contactable with, and separable from, the plate 172. Therefore, when the nozzle holder 92 sucks and holds the suction nozzle 90, it is assured that the inner annular plate 178 is contacted with, and electrically connected to, the lower surface 138 of the spline axis member 94 and the outer annular plate 178 is contacted with, and electrically connected to, the lower surface 142 of the attraction member 140. For example, in the case where the inner annular member 178 contacts the lower surface 138 earlier than the outer annular member 180 contacts the lower surface 142, the outer peripheral portion of the support plate 172 is sucked by the negative pressure and separated from the annular PCB 166, so that the outer peripheral portion of the support plate 172 is elastically deformed toward the lower surface 142 and eventually the outer annular plate 180 contacts the lower surface 142. On the other hand, in the case where the outer annular member 180 contacts the lower surface 142 earlier than the inner annular member 178 contacts the lower surface 138, the inner peripheral portion of the support plate 172 is sucked by the negative pressure, so that the inner peripheral portion of the support plate 172 is elastically deformed toward the lower surface 138 and eventually the inner annular plate 178 contacts the lower surface 138. Since the outer peripheral portion of the support plate 172 is not fixed to the annular PCB 166, the rigidity of the support plate 172 is low, the small space 175 is provided between the LEDs 168 and the bottom surface of the annular recess 170 of the diffusion plate 162, and the small space 177 is provided between the outer edge portion of the support plate 172 and the outer edge portion of the diffusion plate 162, the elastic deformation of the support plate 172 is permitted, which assures that the closure surface 186 is contacted with, and electrically connected to, the suction surface 144.

In the state in which the support plate 172 is elastically deformed to allow the suction nozzle 90 to be sucked and held by the nozzle holder 92, the electric connection between the outer annular plate 180 and the anodic portion of the electric circuit of the annular PCB 166 and the electric connection between the inner annular plate 178 and the cathodic portion of the electric circuit of the annular PCB 166 are maintained by the expansion of the first or second springs 174, 176. Since the closure surface 186 is reliably contacted with the suction surface 144 in this way, the leakage of the negative pressure is prevented and the suction nozzle 90 is fixedly held by the nozzle holder 92.

The supplying device 18 which is of a tray type in the present embodiment includes a stepped support table 200 fixed to the base 10, and a plurality of tray accommodating boxes 202 (three boxes 202 in the present embodiment) which are arranged on the support table 200 in the X-axis direction such that each pair of adjacent boxes 202 are spaced from each other. The stepped support table 200 includes a front higher portion 203 and a rear lower portion 204. A bottom plate (not shown) is provided on the rear portion 204, columns (not shown) stand on the bottom plate, and a top plate is supported on the columns. Thus, the bottom plate, the columns, and the top plate cooperate with one another to define a space which opens toward the EC holding head 30 and in which each of the tray accommodating boxes 202 can be elevated and lowered.

Figure 4:
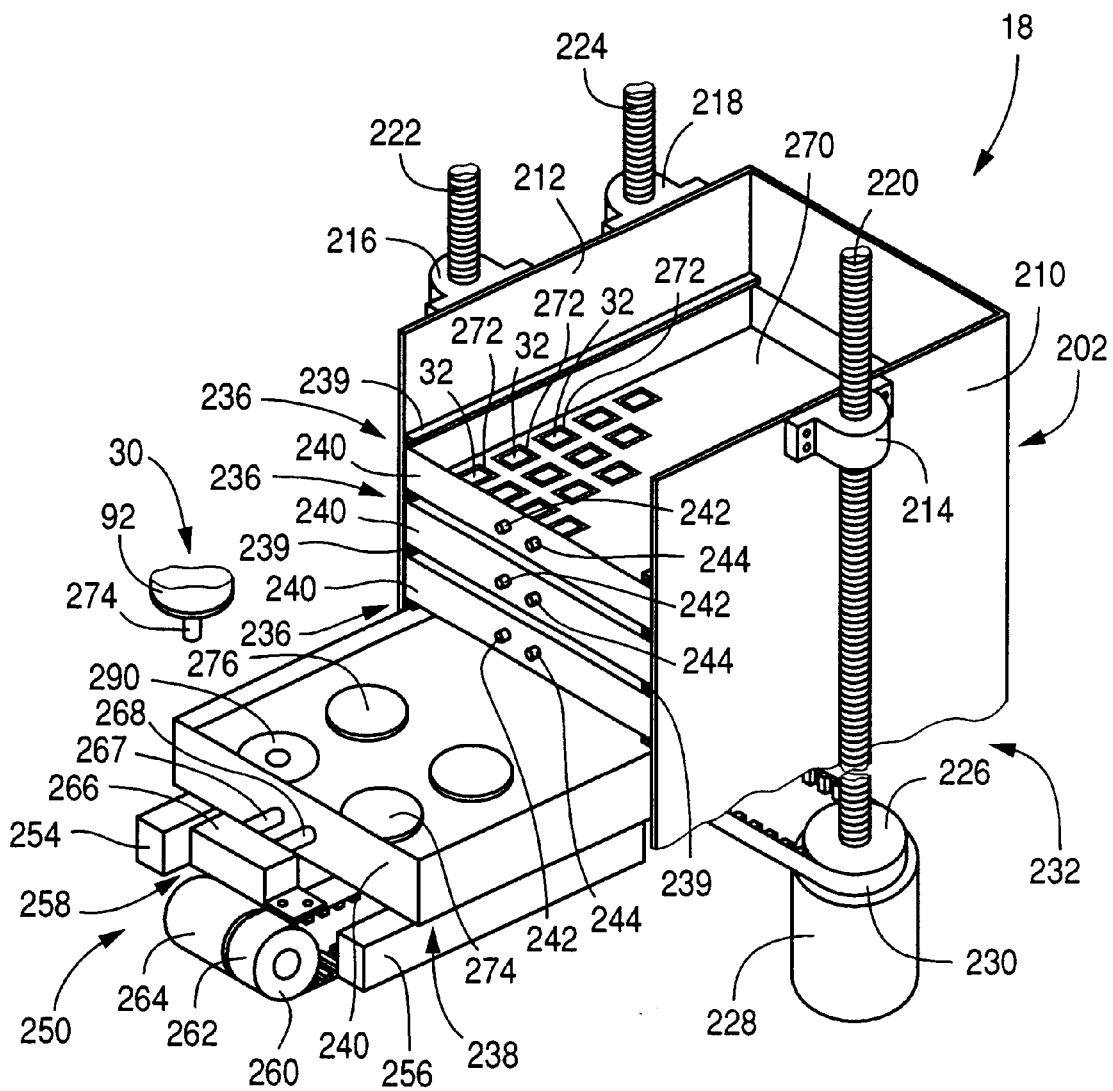
FIG. 4 is a perspective view of a relevant portion of a supplying device of the EC supplying system of FIG. 1.

As shown in FIG. 4, each of the tray accommodating boxes 202 opens toward the EC holding head 30. Each box 202 includes two side plates 210, 212 which are spaced from each other in a widthwise direction of the box 202. A nut 214 is fixed to an outer surface of the first side plate 210, and two nuts 216, 218 are fixed to an outer surface of the second side plate 212. The three nuts 214, 216, 218 are threadedly engaged with three ball screws 220, 222, 224, respectively, which vertically extend parallel to each other. Respective upper end portions of the ball screws 220, 222, 224 are rotatably supported by the top plate, and respective lower end portions of the same 220, 222, 224 are rotatably supported by the bottom plate. A first pulley 226 is attached to the lower end portion of the first ball screw 220 that projects downward from the bottom plate, and an output shaft of an elevating and lowering servomotor 228 is connected to the pulley 226. When the servomotor 228 is rotated, the first ball screw 220 is rotated about a vertical axis line. Similarly, a second and a third pulley (not shown) are attached to the respective lower end portions of the second and third ball screws 222, 224 that project downward from the bottom plate, and a cog or timing belt 230 is wound on the first pulley 226 and the second and third pulleys. Thus, the second and third ball screws 222, 224 are rotated in synchronism with the rotation of the first ball screw 220. The ball screws 220, 222, 224, the first pulley 226, the second and third pulleys, the timing belt 230, and the elevating and lowering servomotor 228 cooperate with one another to provide an elevating and lowering device 232 which elevates and lowers each of the tray accommodating boxes 202. An amount of rotation of the elevating and lowering servomotor 228 is detected by an encoder 234, which is connected to the control device 310. Thus, the control device 310 obtains, from the encoder 234, information indicative of a distance of upward or downward movement of each of the tray accommodating boxes 202.

Each tray accommodating box 202 accommodates a plurality of trays 236, 238 which store a plurality of ECs 32 and a plurality of suction nozzles 90, such that the plurality of trays 236, 238 are piled on each other in a vertical direction. A plurality of pairs of guide rails 239 are fixed to respective inner surfaces of the two side plates 210, 212, such that each pair of guide rails 239 are parallel to, and level with, each other. Each of the trays 236, 238 is drawn from, and inserted into, the tray accommodating box 202, while being guided by a corresponding pair of guide rails 239. Each of the trays 236, 238 has a shallow-container-like or dish-like configuration and opens upward. The lowermost tray 238 is slightly deep than the other three upper trays 236. Each of the trays 236, 238 has, on its front wall, a pair of cylindrical-bar-like engageable projections 242, 244 which are spaced from each other in the widthwise direction of the tray accommodating box 202.

After one of the trays 236, 238 accommodated in the tray accommodating box 202 is positioned at a predetermined tray-draw position by the elevating and lowering device 232, a tray drawing device 250 draws the one tray 236, 238 from the box 202 in the Y-axis direction, and positions the one tray 236, 238 at a predetermined supply position. The three tray drawing devices 250 for the three boxes 202 are provided on the front portion 203. Each of the tray drawing devices 250 includes a pair of guide rails 254, 256 which extend parallel to each other in the Y-axis direction and which cooperate with each other to guide each tray 236, 238; an engaging device 258 which is movable parallel to the guide rails 254, 256; a pair of pulleys 260 which are spaced from each other in the Y-axis direction (only one 260 is shown in FIG. 4); a belt 262 which is wound on the pulleys 260; and a drawing servomotor 264 which is connected to the engaging device 258 via the belt. The engaging device 258 is connected to the belt 262 and, when the servomotor 264 is rotated and the belt 262 is circulated, the engaging device 258 is moved in the Y-axis direction. An amount of rotation of the drawing servomotor 264 is detected by an encoder 265, which is connected to the control device 310. Thus, the control device 310 obtains, from the encoder 265, information indicative of a distance of movement of each of the trays 236, 238. A pair of guide rails (not shown) as guide members are provided, on the support table 200, below the engaging device 256, and the engaging device 258 fits on the two guide rails via respective guide blocks (not shown) as guided members, such that the engaging device 258 is slideable or movable on the guide rails by being guided by the same.

The engaging device 258 includes a main member 266, and a pair of engageable portions 267, 268 which project from a rear surface of the main member 266 that is opposed to the tray 236, 238 being positioned or indexed at the tray-draw position. The two engageable portions 267, 268 project from respective positions of the rear surface that correspond to the two engageable projections 242, 244 of the indexed tray 236, 238, respectively. The two engageable portions 267, 268 have respective diameters greater than those of the engageable projections 242, 244, and accommodate respective holding devices (not shown), such as collet chucks. Respective collets of the two collet chucks are movable with a piston of a hydraulic actuator which is provided in the main member 266. When the actuator is operated, the collets are advanced and retracted, so that respective inner diameters of the engageable portions 267, 268 are increased and decreased. When the collets are engaged with the engageable projections 242, 244 and then are retracted with the projections 242, 244, the inner diameters of the collets are decreased owing to respective tapered inner surfaces of the engageable portions 267, 268, so that the collects fixedly grasp the projections 242, 244, respectively. Thus, the indexed tray 236, 238 is placed in a state in which the indexed tray 236, 238 is movable with the engaging device 258. On the other hand, when the inner diameters of the collets are increased, the engageable portions 267, 268 are allowed to disengage from the engageable projections 242, 244. Since the collet chucks and the hydraulic actuator are well known in the art, no more detailed description thereof is provided.

The tray-draw position is defined as the position where the engageable projections 242, 244 of one of the trays 236, 238 are opposed to the engageable portions 267, 268 of the engaging device 258. The engaging device 258 engages the engageable projections 242, 244 of one tray 236, 238 being positioned or indexed at the tray-draw position, and moves the one tray 236, 238 in the Y-axis direction while the tray 236, 238 is guided by the guide rails 254, 256. Thus, the tray 236, 238 is drawn out to the supply position. When the tray 236, 238 drawn out is drawn into the tray accommodating box 202, first, the collets of the engageable portions 267, 268 are advanced and the engageable projections 242, 244 are released from the engageable portions 267, 268, respectively, and then respective end surfaces of the engageable portions 267, 268 push the tray 236, 238 back. Thus, the tray 236, 238 is moved in a direction opposite to the direction in which the tray 236, 238 is drawn out. Alternatively, it is possible that the engaging device 258 be moved back in the opposite direction with the engageable portions 267, 268 engaging the engageable projections 242 and, after the tray 236, 238 is completely accommodated in the box 202, the engageable portions 267, 268 be disengaged from the engageable projections 242.

Each of the three trays 236 stores a plurality of ECs 32 of one sort, and the three trays 236 store the ECs 32 of three different sorts, respectively. The fourth tray 238 stores a plurality of suction nozzles 90 for each of a plurality of different sorts. In the present embodiment, each tray accommodating box 202 accommodates the plurality of EC storing trays 236 and the single suction-nozzle storing tray 238. However, each box 202 may accommodate a plurality of suction-nozzle storing trays 238 in addition to a plurality of EC storing trays 236.

Each of the EC storing trays 236 accommodates a plurality of flat receptacle members 270 which are piled on each other in a vertical direction. Each of the flat receptacle members 270 has, in its upper surface, a number of EC storing recesses 272 which are spaced from each other in each of the X-axis and Y-axis directions. A single EC 32 is stored in each of the recesses 272.

Figure 5:
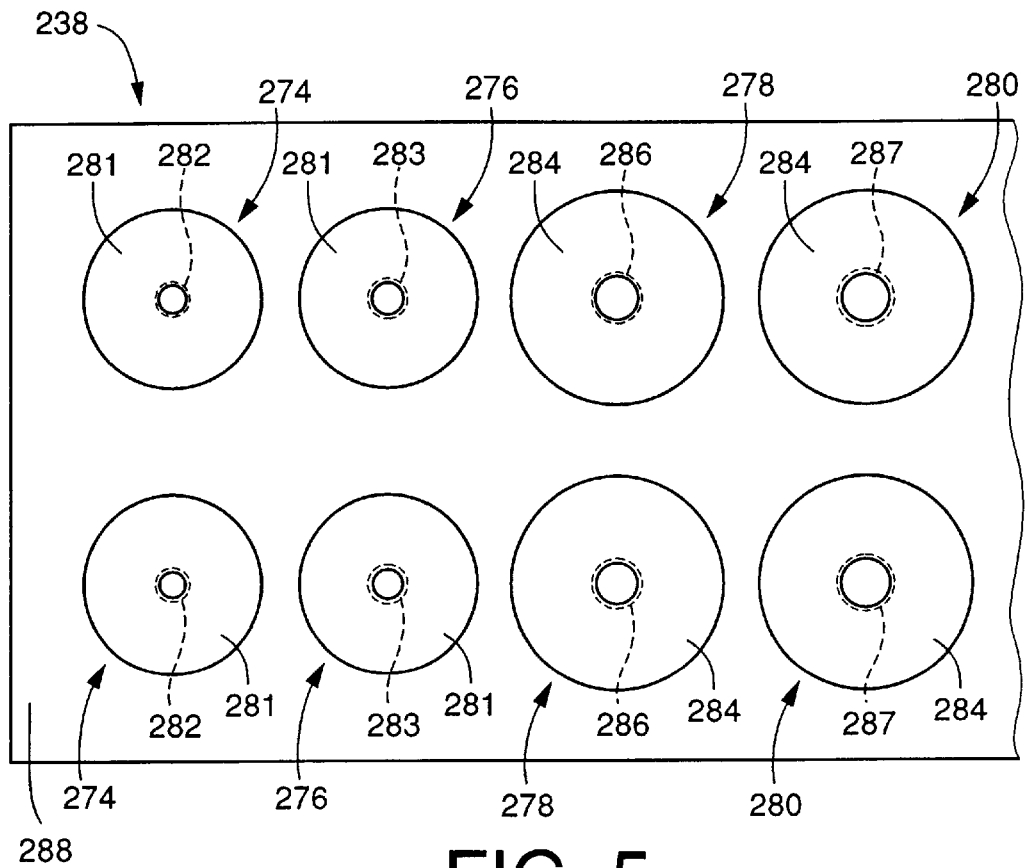
FIG. 5 is a plan view of a relevant portion of a tray of the supplying device of FIG. 4.

As shown in FIG. 5, the suction-nozzle storing tray 238 stores two suction nozzles 274 of a first sort, two suction nozzles 276 of a second sort, two suction nozzles 278 of a third sort, and two suction nozzles 280 of a fourth sort, that is, stores eight suction nozzles in total, two for each sort. The first and second sorts of suction nozzles 274, 276 have respective diffusion plates 281 whose diameter is equal to that of the attraction member 140 of the suction holder 92, and the second sort of nozzles 276 have respective suction pipes 283 whose diameter is slightly larger than that of respective suction pipes 282 of the first sort of nozzles 274. The third and fourth sorts of suction nozzles 278, 280 have respective diffusion plates 284 whose diameter is slightly larger than that of the diffusion plates 281 of the first and second sorts of nozzles 274, 276, the third sort of nozzles 278 have respective suction pipes 286 whose diameter is slightly larger than that of the suction pipes 283 of the second sort of nozzles 276, and the fourth sort of nozzles 280 have respective suction pipes 287 whose diameter is slightly larger than that of the suction pipes 286 of the third sort of nozzles 278. Although the suction pipes 282, 283, 286, 287 of the suction nozzles 274, 276, 278, 280 have different diameters, each of the pipes 282, 283, 286, 287 has a length sufficient to reach the ECs stored in the lowermost receptacle member 270 accommodated in each of the EC storing trays 236. However, the first to fourth sorts of suction nozzles 274, 276, 278, 280 which include the suction pipes 282, 283, 286, 287 having different diameters may include respective diffusion plates each having a common diameter.

Figure 6:
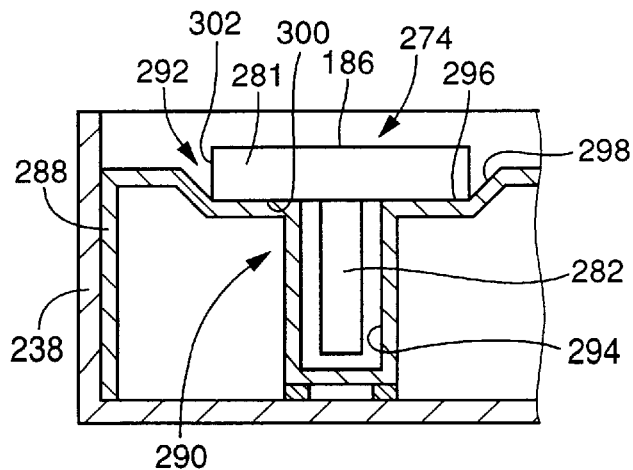
FIG. 6 is a cross-sectioned side view of a relevant portion of the tray of FIG. 5.

The suction nozzles 274, 276, 278, 280 are stored in a plurality of nozzle storing recesses 290, respectively, which are formed in a receptacle member 288. Generally, the receptacle member 288 has a box-like configuration which opens toward a bottom surface of the nozzle storing tray 238. The receptacle member 288 fits in an inner space of the tray 238, such that the receptacle member 288 is detachable or separable from the tray 238. The nozzle storing recesses 290 are formed in an upper surface of the receptacle member 288, such that the recesses 290 are spaced from each other in each of the X-axis and Y-axis directions. The nozzle storing recesses 290 have similar structures except for their dimensions. FIG. 6 shows a nozzle storing recess 290 for storing a suction nozzle 274, as a representative of all the recesses 290. The nozzle storing recess 290 includes a dish-like portion 292 capable of receiving the diffusion plate 281 of the suction nozzle 274, and a cylindrical portion 294 capable of receiving the suction pipe 282 of the nozzle 274. The cylindrical portion 294 has a diameter smaller than that of the dish-like portion 292. Thus, the recess 290 has a stepped configuration. A bottom surface of the dish-like portion 292 provides a seat or support surface 296 for supporting the diffusion plate 281. The dish-like portion 292 additionally has a tapered inner surface 298 whose diameter decreases in a direction toward the support surface 296. Thus, the center line of the suction nozzle 274 is positioned relative to the recess 290. In the state in which a bottom surface 300 of the diffusion plate 281 is seated on the seat surface 296 of the dish-like portion 296 and the suction nozzle 274 is prevented from being moved in a horizontal plane by the cooperation of an outer circumferential surface 302 of the diffusion plate 281 and the inner tapered surface of the dish-like portion 292, the suction nozzle 274 is accurately positioned relative to the recess 290. In this state, the nozzle 274 is stored in the recess 290. The nozzle storing recesses 290 are adapted such that in the state in which the suction nozzles 274, 276, 278, 280 are stored in the recesses 290, respective upper surfaces of the nozzles 274–280, that is, respective closure surfaces 186 of the nozzles 274–280 are located in a common plane. Thus, the suction holder 92 can hold and release each of the suction nozzles 274–280, at a predetermined common height position.

The present EC mounting system 12 is controlled by the control device 310 shown in FIG. 7. The control device 310 is essentially provided by a computer 320 including a processing unit (PU) 312, a read only memory (ROM) 314, a random access memory (RAM) 316, and a bus 318 for connecting those elements 312, 314, 316 to one another. An input interface 322 and an output interface 324 are connected to the bus 318. The CCD cameras 50, 86 and the encoders 132, 234, 265 are connected to the input interface 322. The PCB conveyor 22, the X-axis servomotors 38, the Y-axis servomotor 44, the rotating servomotor 106, the elevating and lowering servomotor 130, the solenoid valves 151, 152, 158, the elevating and lowering servomotors 228, and the drawing servomotors 264 are connected to the output interface 324 via respective drive circuits 326, 328, 330, 332, 334, 336, 338, 340, 342.

The above-indicated servomotors 38, 44, 106, 130, 228 264 are a sort of electric motors as drive sources which are controllable with respect to their rotation angle. Those servomotors may be replaced with stepper motors.

Figure 8:
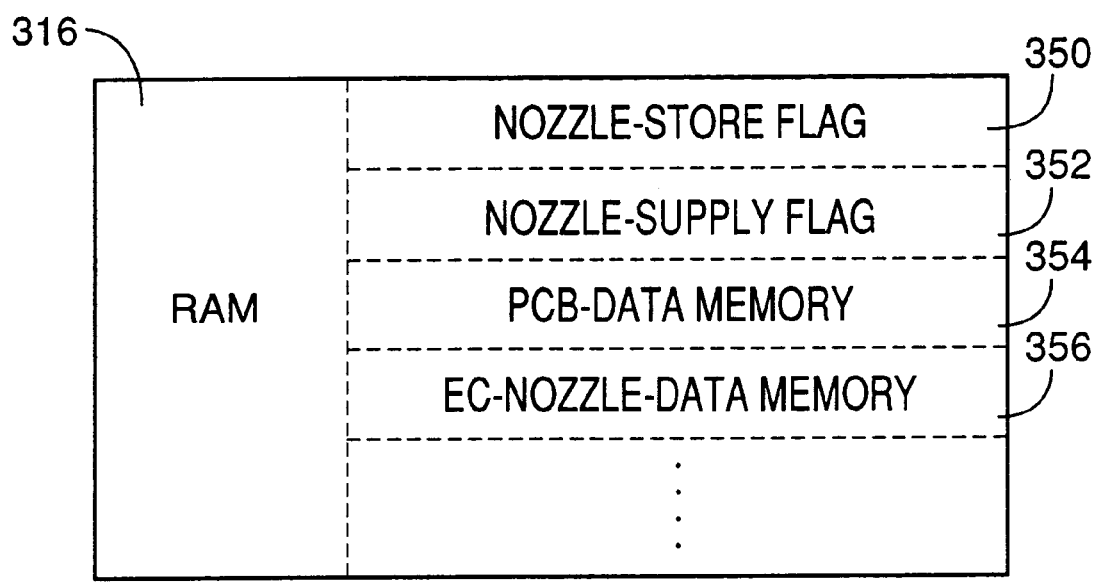
FIG. 8 is a diagrammatic view of a random access memory (RAM) of a computer of the control device of FIG. 7.

As shown in FIG. 8, the RAM 316 includes a nozzle-store flag 350, a nozzle-supply flag 352, a PCB-data memory 354, and an EC-nozzle-data memory 356. The PCB-data memory 354 stores a batch of PCB-data which are representative of respective sorts of ECs 32 to be mounted on a PCB 24 to provide an electric circuit, and respective EC-mount places on the PCB 24 where the ECs 32 are to be mounted. The EC-mount places on the PCB 24 are pre-determined on an X-Y coordinate plane defined by an X axis and a Y axis which are perpendicular to each other. The PCB-data memory 354 may be one which can store a new batch of PCB data in place of the current batch of PCB being deleted, or one which can store a plurality of batches of PCB data and which allows each one batch of PCB data to be selectively read out.

The EC-and-nozzle-data memory 356 stores a batch of EC data and a batch of nozzle data. The batch of EC data represent, for each sort out of all the sorts of ECs 32, the respective positions (i.e., X and Y coordinates) of all the ECs of the each sort, that is, a particular one (M=1, 2, or 3) of the three tray accommodating boxes 202, a particular one (N=1, 2, or 3) of the three EC-store trays 236 of the particular box 202, and a particular position on the particular tray 236 where each of all the ECs 32 of the each sort is stored. The batch of EC data represent, in a predetermined order, the respective positions of all the ECs of the each sort that are stored in the nine trays 236 in total. The batch of nozzle data represent, for each sort out of all the sorts of suction nozzles 274–280, the respective positions (i.e., X and Y coordinates) of all the nozzles of the each sort 274–280, that is, a particular one (M=1, 2, or 3) of the three boxes 202 and a particular position on the tray 238 of the particular box 202 where each of all the nozzles of the each sort 274–280 is stored. When one EC 32 is supplied from the supplying device 18, the data representing the position of the one EC 32 is deleted. Thus, the amount of the batch of EC data gradually decreases. However, the amount of the batch of nozzle data do not change because, when the current suction nozzle 274–280 is changed with another nozzle, the current nozzle is again stored at the position where the nozzle had been stored before the current use.

The ROM 314 stores various control programs including (1) an EC-mount control routine needed to suck up the ECs 32 and the suction nozzles 274–280 and mount the ECs 32; (2) an EC-nozzle-supply control routine; and (3) a holding-head control routine.

Figure 10:
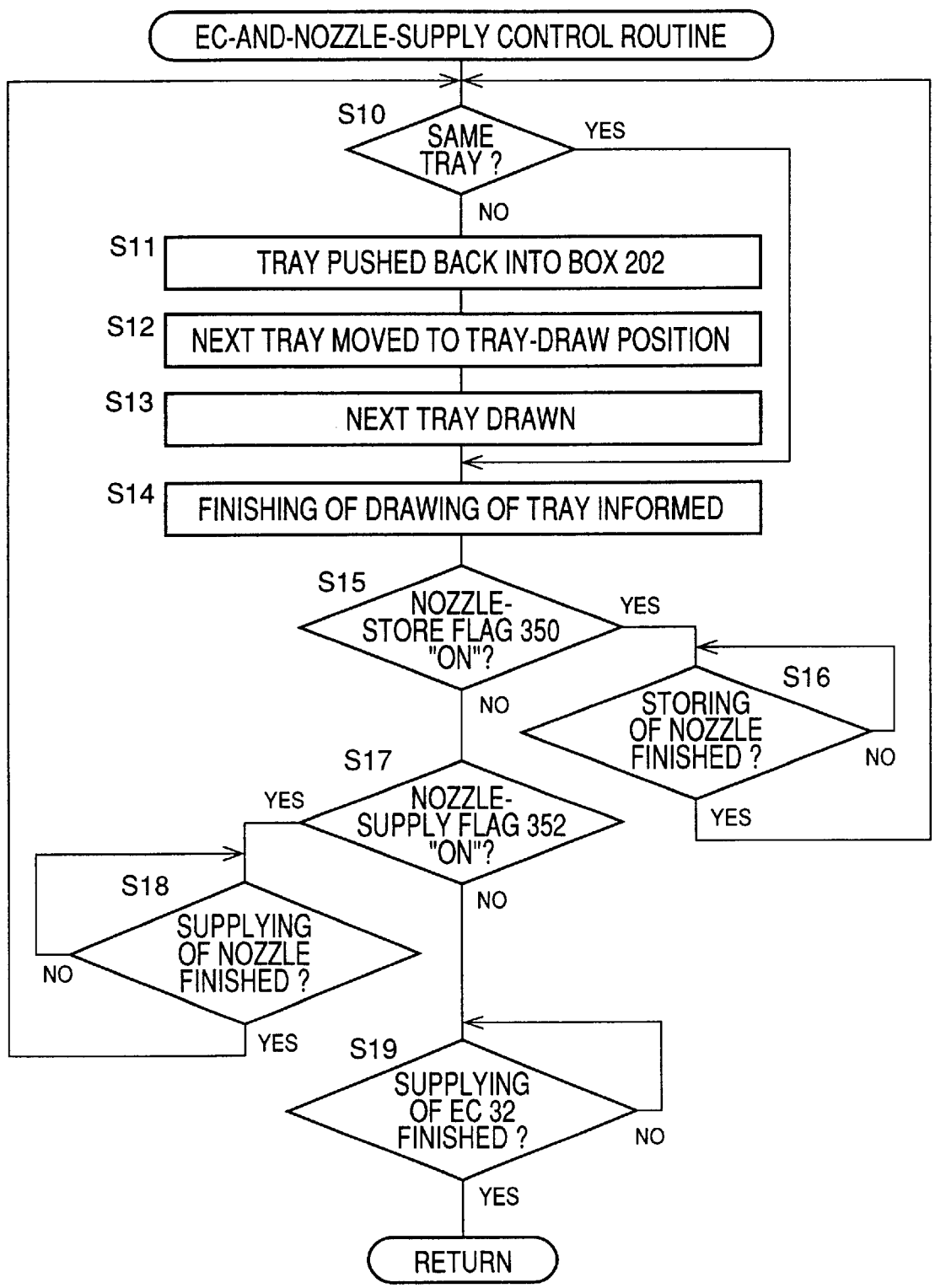
FIG. 10 is a flow chart representing an EC-and-nozzle-supply control routine stored in the ROM of the control device of FIG. 7.
Figure 11:
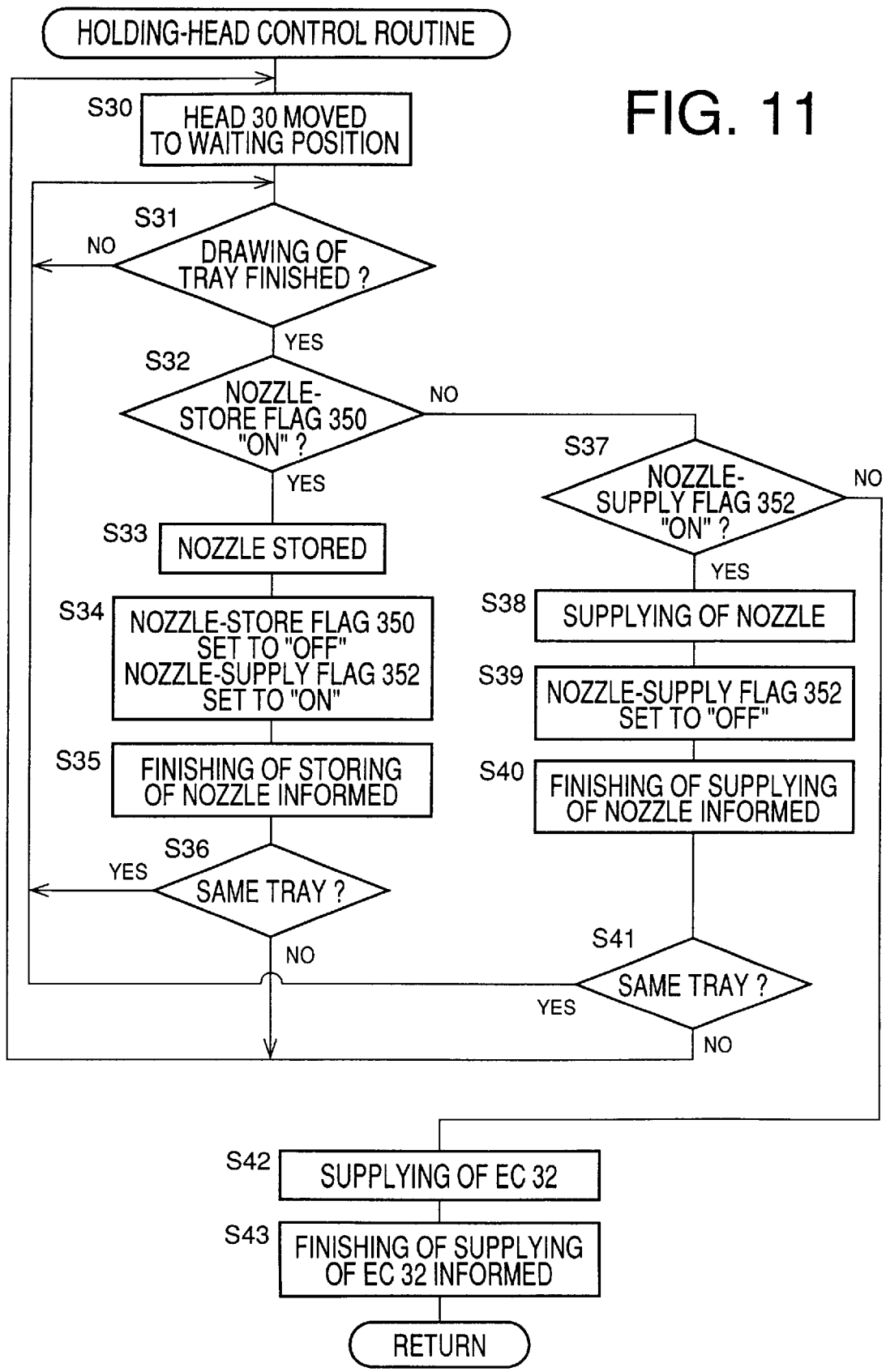
FIG. 11 is a flow chart representing an EC-holding-head control routine stored in the ROM of the control device of FIG. 7.

Hereinafter, there will be described the manners in which the ECs 32 and the suction nozzles 274–280 are sucked and held and the ECs 32 are mounted, by reference to the flow charts of FIGS. 9, 10, and 11 which represent the above-indicated three control routines, respectively.

Figure 9:
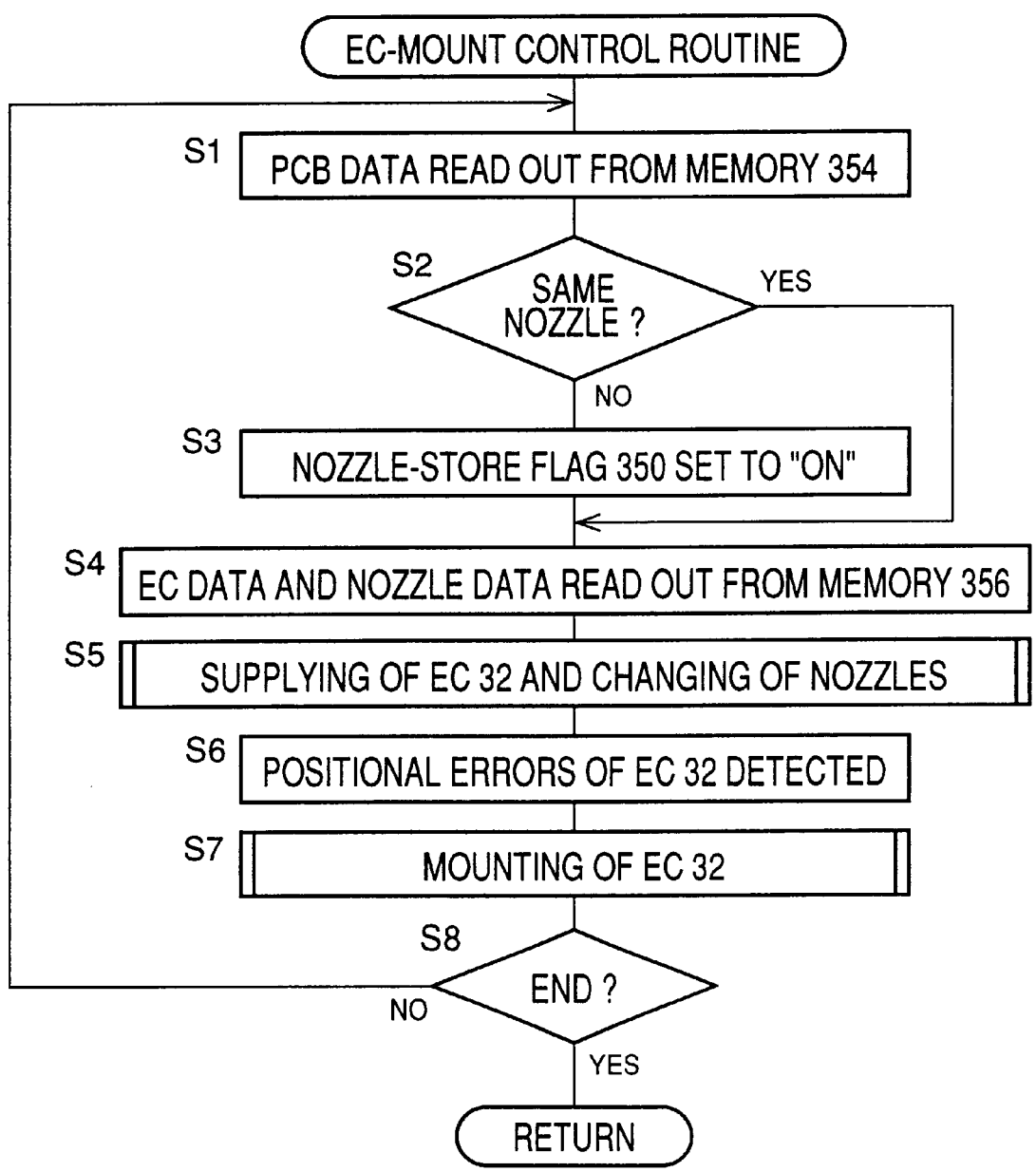
FIG. 9 is a flow chart representing an EC-mount control routine stored in a read-only memory (ROM) of the computer of the control device of FIG. 7.

In the EC-mount control routine shown in FIG. 9, first, at Step S1, the PU 312 reads out, from the PCB-data memory 354 of the RAM 316, data representative of the sort of an EC 32 to be first mounted on a PCB 24 and the EC-mount place on the PCB 24 where the first EC 32 is to be mounted. Subsequently, at Step S2, the PU 312 judges, based on the sort of the first EC 32, whether the suction nozzle which is currently used (e.g., nozzle 274) is to be used again. In the case where the current nozzle 274 is to be changed with the next nozzle corresponding to the sort of the first EC 32, a negative judgment is made at Step S2. In this case, the control of the PU 312 goes to Step S3 to set the nozzle-store flag 350 to its "ON" state. On the other hand, if a positive judgment is made at Step S2, the control skips Step S3 and goes to Step S4. At Step S4, if the nozzle-store flag 350 is in its "OFF" state, the PU 312 reads out, from the EC-and-nozzle-data memory 356, data representative of the storage position where the above-indicated first EC 32 is stored. In addition, if the nozzle-store flag 350 is in its "ON" state, the PU 312 reads out, from the EC-and-nozzle-data memory 356, data representative of the storage position where the above-indicated next nozzle is stored. Subsequently, the control of the PU 312 goes to Step S5 to carry out the EC-nozzle-supply control routine and the holding-head control routine which will be described later. Thus, the first EC 32 is taken out from the supplying device 18 and, if necessary, the current nozzle 274 is changed with the next nozzle. Step S5 is followed by Step S6 where the CCD camera 50 takes an image of the EC 32 sucked and held by the EC holding head 30, and the PU 312 (or the control device 310) compares the thus obtained image data with reference-image data representative of a reference image of an EC 32 which is correctly held by the head 30 without any positional errors and rotation-position error of the EC 32. Thus, the PU obtains data representative of X-axis and Y-axis positional errors of the first EC 32 and a rotation-position error of the same 32, if any. Meanwhile, possible X-axis and Y-axis positional errors of the PCB 24 are detected, in advance, based on an image of the reference marks of the PCB 24 which is taken by the CCD camera 86. During the time duration in which the EC holding head 30 is moved to the EC-mount position, the EC-mount place represented by the data read out from the PCB-data memory 354, is corrected based on the X-axis and Y-axis positional errors of the first EC 32 and the X-axis and Y-axis positional errors of the PCB 24, and the current rotation position of the EC 32 is corrected by the rotation of the rotating device 82. Then, at Step S7, the EC holding head 30 mounts the first EC 32 at the corrected EC-mount place on the PCB 24, with the first EC 32 having the corrected rotation position. Step S7 is followed by Step S8 to judge whether the current EC-mount control operation ends. Steps S1 to S7 are repeated till a positive judgment is made at Step S8.

Next, the EC-and-nozzle-supply control routine and the holding-head control routine will be described in this order by reference to FIGS. 10 and 11, respectively. However, the supplying of the ECs 32 and the changing of the suction nozzles 274–280 are performed while the above two control routines are executed by time sharing. The following description relates to a particular case where the current suction nozzle 274 having the small-diameter suction pipe 282 is changed with the nozzle 276 having the large-diameter pipe 283, because, after a first sort of ECs 32 are mounted on the PCB 24, a different or second sort of ECs 32 are mounted on the same 34. Otherwise, the current nozzle 274 may be changed with another nozzle 274 of the same sort, in the case where the current nozzle 274 is functionally damaged.

First, at Step S10, the PU judges whether the tray 236, 238 which is currently positioned at the supply position is to be used again, that is, whether one EC 32 is to be supplied from the tray 236, 238 currently being positioned at the supply position, or the current suction nozzle 274 is to be changed with another nozzle stored in the tray 236, 238 currently being positioned at the supply position. Since it is assumed that the supplying of the ECs 32 of the first sort is switched to the supplying of the ECs 32 of the second sort and the current suction nozzle 274 is changed with the nozzle 276, a negative judgment is made at Step S10, and the control of the PU 312 goes to Step S11 where the drawing device 250 pushes back and returns the current tray 236 into the tray accommodating box 202 being indexed. Subsequently, the control of the PU 312 goes to Step S12 to elevate or lower, based on the nozzle data stored in the EC-and-nozzle-data memory 356, the tray accommodating box 202 so that the nozzle-store tray 238 is positioned and stopped at the tray-draw position. Step S12 is followed by Step S13 where the drawing device 250 draws the tray 238 being positioned at the tray-draw position. Subsequently, the control of the PU 312 goes to Step S14 where the state in which the drawing of the tray 238 has been finished is detected and informed to the control device 310. Step S14 is followed by Step S15 to judge whether the nozzle-store flag 350 is in its "ON" state. Under the above-indicated assumption, a positive judgment is made at Step S15, and the control of the PU 312 goes to Step S16 to judge whether the storing of the suction nozzle 274 being currently held by the nozzle holder 92 is finished. Step S16 is repeated till the current nozzle 274 is stored. If a positive judgment is made, the control of the PU 312 goes back to Step S10. Then, the nozzle holder 92 takes the suction nozzle 276 from the same tray 238. Therefore, a positive judgment is made at Step S10, and the control of the PU 312 skips Steps S11, S12, and S13 and goes to Step S14 where the state in which the drawing of the tray 238 has been finished is informed to the control device 310. At this point of time, the nozzle-store flag 350 is in its "OFF" state. Accordingly, a negative judgment is made at Step S15, and the control of the PU 312 goes to Step S17 to judge whether the nozzle-supply flag 352 is in its "ON" state. In the case where a positive judgment is made, the control goes to Step S18 to judge whether the supplying of the nozzle 276 has been finished. Step S18 is repeated till the supplying of the nozzle 276 has been finished. If a positive judgment is made at Step S18, the control of the PU 312 goes back to Step S10.

Next, the suction nozzle 276 sucks and holds an EC 32 supplied from the supplying device 18. In this cycle, a negative judgment is made at Step S10, and the control goes to Step S11 and the following steps. The nozzle-store tray 238 is pushed back into the tray accommodating box 202 being indexed, and one of the EC-store trays 236 is drawn out from the box 202. Since each of the nozzle-store flag 350 and the nozzle-supply flag 352 is in its "OFF" state, a negative judgment is made at each of Steps S15 and S17, and the control goes to Step S19 to judge whether the supplying of the EC 32 has been finished. If the supplying of the EC 32 has been finished and a positive judgment is made at Step S19, the present control operation ends.

At Step S30 of the holding-head control routine, the control device 310 controls the X-Y robot 48 to move the EC holding head 30 to its waiting position. Subsequently, at Step S31, the PU 312 waits for the nozzle-store tray 238 to be moved to the supply position, and judges whether the drawing of the tray 238 is finished. If a positive judgment is made at Step S31, the control goes to Step S32 to judge whether the nozzle-store flag 350 is in its "ON" state. Under the above-indicated assumption, a positive judgment is made at Step S32, and the control goes to Step S33 where the EC holding head 30 is moved to the supply position where the suction nozzle 274 being currently held by the head 30 is stored. More specifically described, the head 30 is moved horizontally to a position above the empty nozzle-store recess 290, and is moved down till the diffusion plate 281 of the nozzle 274 is seated on the support surface 296. After the seating of the nozzle 274, the nozzle-suck passage 148 is communicated with the atmosphere, so that the nozzle 270 is released from the nozzle holder 92. Thus, the storing of the nozzle 274 is finished. Step S33 is followed by Step S34 to set the nozzle-store flag 350 to its "OFF" state and set the nozzle-supply flag 352 to its "ON" state. Subsequently, at Step S35, the state in which the storing of the nozzle 274 has been finished is informed to the control device 310. Step S35 is followed by Step S36 to judge whether the current tray is to be used again. Under the above-indicated assumption, a positive judgment is made at Step S36, and the control of the PU 312 goes back to Step S31. Since the nozzle-store flag 350 has been set to its "OFF" state and the nozzle-supply flag 352 has been set to its "ON" state, a negative judgment is made at Step S32, a positive judgment is made at Step S37, and the control goes to Step S38 where the suction nozzle 276 is supplied from the supplying device 18 to the nozzle holder 92. More specifically described, after the nozzle holder 92 is moved to a position above the suction nozzle 276, the holder 92 is moved down till the suction surface 144 is brought into close contact with the closure surface 186 and a negative air pressure is supplied to the nozzle-suck passage 148. Thus, the holder 92 sucks and holds the nozzle 276. Then, at Step S39, the nozzle-supply flag 352 is set to its "OFF" state and, at Step S40, the state in which the supplying of the nozzle 276 has been finished is informed to the control device 310. At Step S41, the PU 312 judges whether the current tray is to be used again. Since subsequently the new nozzle 276 sucks and holds an EC 32 under the above-indicated assumption, a negative judgment is made at Step S41, and accordingly the control of the PU 312 goes back to Step S30 where the EC holding head 30 is moved to the waiting position, again. Step S31 is repeated till the drawing of the tray 236 is finished and a positive judgment is made. A negative judgment is made at each of Steps S32 and S37, and the control goes to Step S42 where the EC holding head 30 is moved to the supply position where the head 30 takes the EC 32 from the supplying device 18. Step S42 is followed by Step S43 where the state in which the supplying of the EC 32 has been finished is informed to the control device 310. Thus, the present control operation ends.

The above description relates to the case where, after the changing of the suction nozzle 274 with the suction nozzle 276, the supplying of one EC 32 is carried out. However, two ECs 32 may be successively supplied from the supplying device 18. In the case where the second EC 32 is supplied after the first EC 32 is supplied, a negative judgment is made at each of Steps S15 and S17 of the EC-and-nozzle-supply control routine of FIG. 10, and the control of the PU 312 goes to Step S19 to carry out the supplying of the second EC 32. In addition, a negative judgment is made at each of Steps S32 and S37, and the control of the PU 312 goes to Step S42 to receive the second EC 32 from the supplying device 18.

When all the ECs 32 stored in one of the flat receptacle members 270 piled in each EC-store tray 236 have been supplied, the thus emptied receptacle member 270 needs to be discarded. To this end, the EC mounting device 16 is provided with a suction device (not shown) which sucks and holds the empty receptacle member 270 and discards the same 270. For example, Japanese Patent Application laid open for public inspection under Publication No. 6(1994)-296092 discloses, as an example of the suction device, a tray sucking head which can hold a tray sucking nozzle in place of an EC sucking nozzle. The tray sucking nozzle sucks and holds the receptacle member 270. Since this sucking device is not relevant to the present invention, no detailed description thereof is provided.

It emerges from the foregoing description that, in the present embodiment, the EC holding head 30 functions as a receiving device which receives an EC 32 from the supplying device 18; the suction nozzles 90, 274, 276, 278, 280 function as EC holders which hold respective ECs 32; and the nozzle holder 92 functions as a movable member to which one of the EC holders is detachably attached. The X-Y robot 48 and the elevating and lowering device 82 cooperate with each other to provide a movable-member moving device which moves the movable member. The EC-and-nozzle-supply control routine shown in FIG. 10 provides a supply control program; and the holding-head control routine shown in FIG. 11 provides a reception control program. The ROM 314 of the computer 320 of the control device 310 provides a recording medium for recording the supply control program and/or the reception control program. The closure surface 186 of each of the suction nozzles 90, 274–280 provides an attachable portion which is detachably attachable to the movable member. Each of the tray accommodating boxes 202 provides a tray accommodating member; and each of the elevating and lowering devices 232 and a corresponding one of the drawing devices 250 cooperate with each other to provide a tray moving device.

In the present embodiment, the plurality of ECs 32 are stored in each of the EC-store trays 236 of each of the tray accommodating boxes 202, and the plurality of suction nozzles 274, 276, 278, 280 are stored in the nozzle-store tray 238 of each of the boxes 202. Each of the boxes 202 accommodates the EC-store trays 236 and the nozzle-store tray 238 in such a manner that the four trays 236, 238 are piled on one another in a vertical direction. Therefore, no exclusive suction-nozzle supplying devices are needed or employed. Thus, the supplying device 18 as a whole enjoys a compact construction. In addition, the ECs 32 and the suction nozzles 274–280 can be supplied in substantially the same manner in which each of the tray accommodating boxes 202 is elevated and lowered and each of the EC-store and nozzle-store trays 236, 238 is drawn out and in. The EC holding head 30 can receive the ECs 32 and the suction nozzles 274–280 in substantially the same manner in which the head 30 is moved by the X-Y robot 48 and the elevating and lowering device 82. Thus, the present EC mounting system 12 as a whole enjoys an improved operation efficiency.

Figure 12:
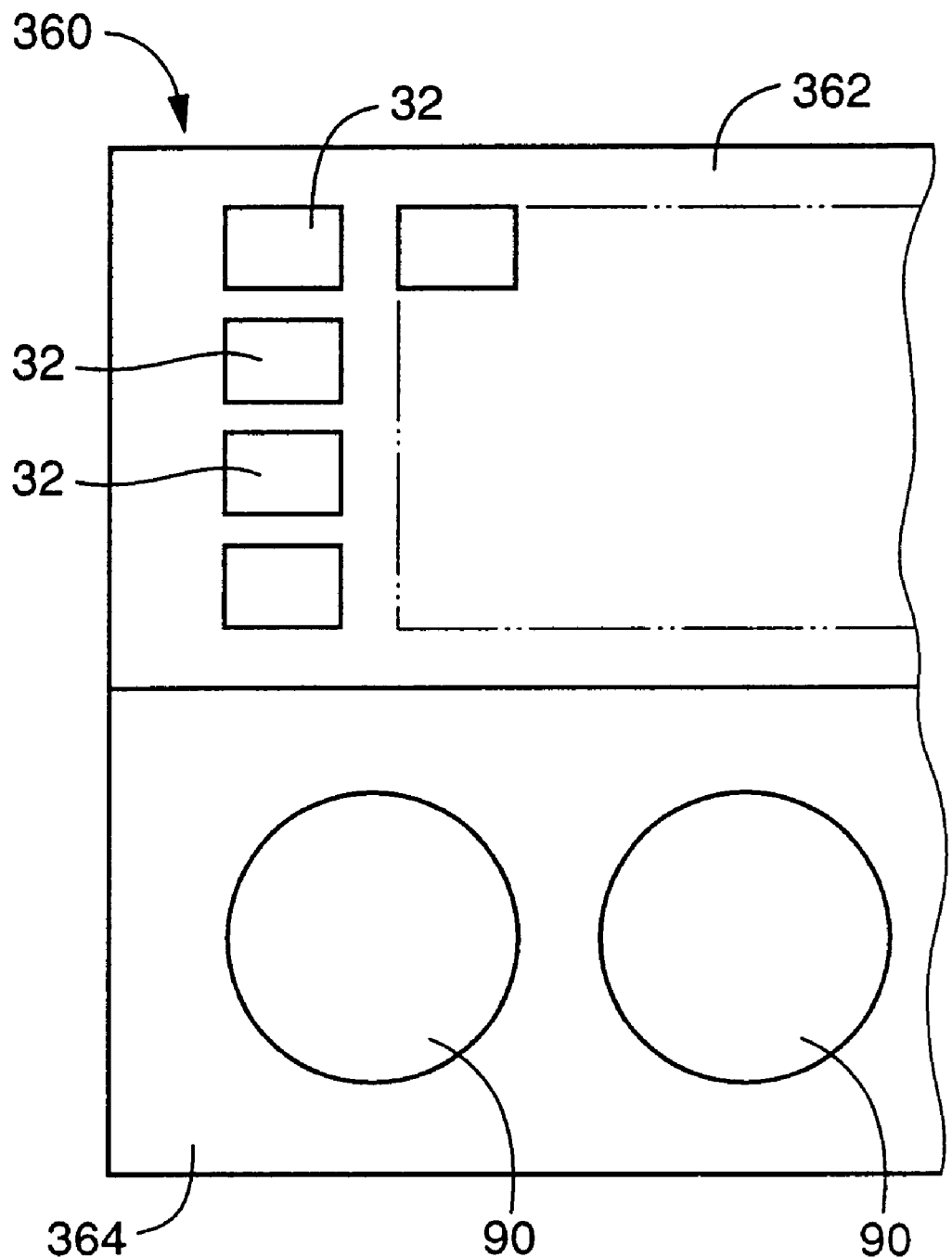
FIG. 12 is a plan view of another supplying device which may be employed in the supplying system of FIG. 1.

In the illustrated embodiment, the ECs 32 are stored in the EC-store trays 236, and the suction nozzles 274, 276, 27, 280 are stored in the nozzle-store trays 238. However, FIG. 12 shows a tray 360 which holds an EC receptacle member 362 for storing a plurality of ECs 32, and a nozzle receptacle member 364 for storing a plurality of suction nozzles 90 each for sucking and holding an EC 32. The tray 360 may be used with the EC mounting system 12.

In the illustrated embodiment, the nozzle receptacle member 288 held by each nozzle-store tray 238 is detachable from the same 238. Therefore, each tray 238 may be used as an EC-store tray wherein the nozzle receptacle member 288 is replaced with a plurality of EC receptacle members 270.

In the illustrated embodiment, each of the trays 236, 238 can be drawn out of, and back into, each tray accommodating box 202. However, the EC holding head 30 may be modified to be able to enter a sufficient space which is secured between each pair of trays 800 which are piled on each other. Since Japanese Patent Application laid open for opposition under Publication No. 2(1990)-57719 discloses examples of the head 30 and trays 800, no detailed description thereof or no drawings thereof are included.

The principle of the present invention is applicable to each of other EC mounting systems which will be described below. The same reference numerals as used in the first embodiment shown in FIGS. 1 to 11 are used to designate the corresponding elements or parts of each of the following embodiments, and the description thereof is omitted.

Figure 13:
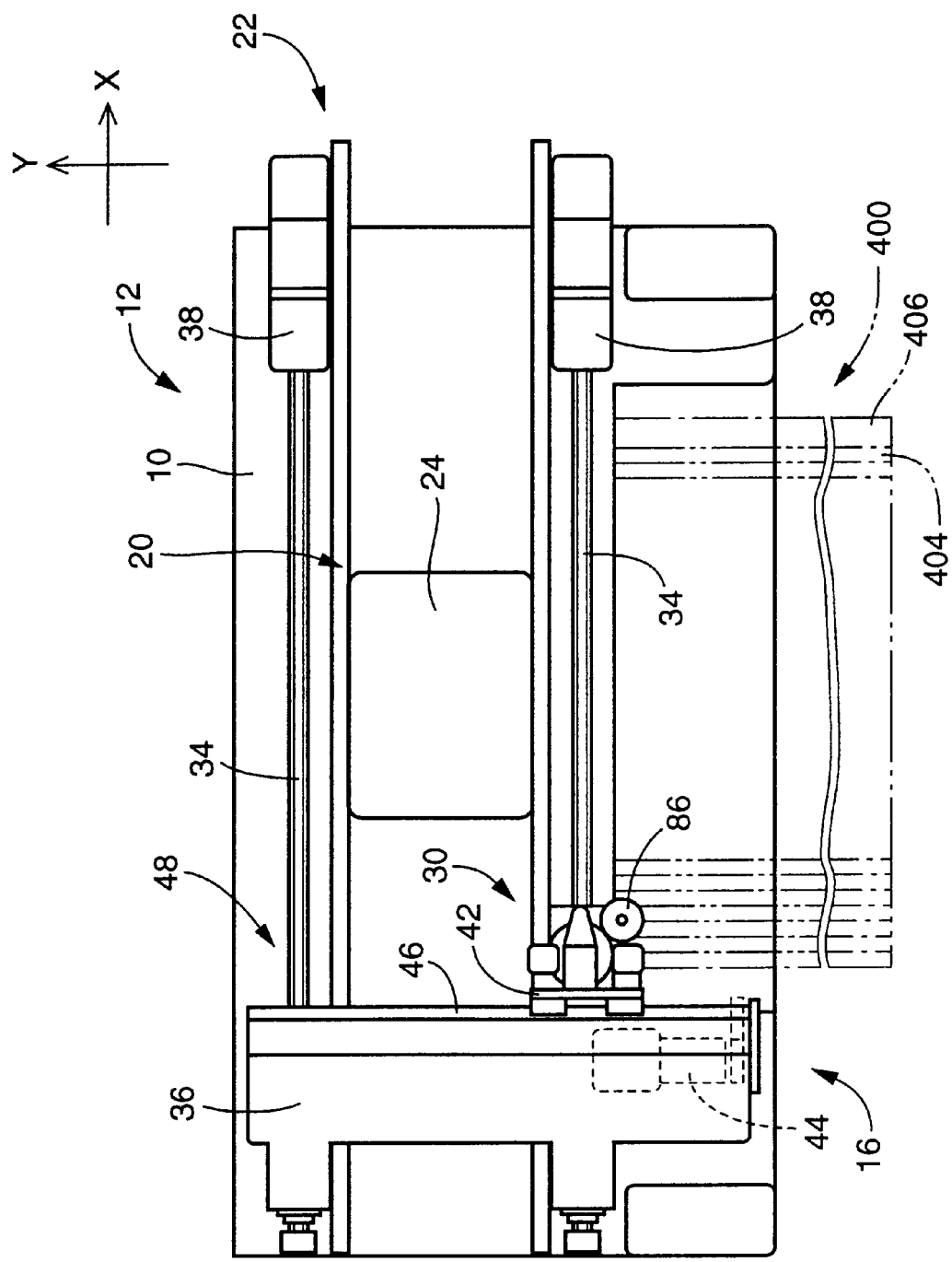
FIG. 13 is a plan view of another EC mounting system including another EC supplying system to which the present invention is applied.
Figure 14:
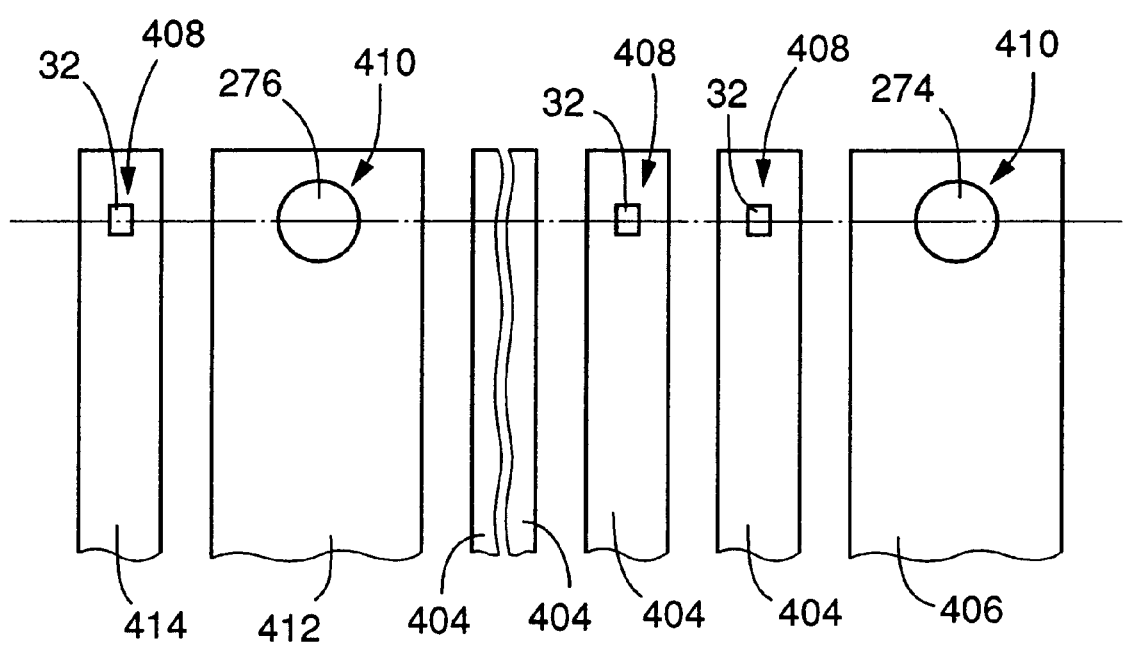
FIG. 14 is a plan view of a relevant portion of a supplying device of the EC supplying system of FIG. 13.

FIG. 13 shows another EC mounting system in which a supplying device 400 is provided on one end portion of a base 10 as seen in a Y-axis direction. The supplying device 400 includes a plurality of EC feeders 404, 414 (FIG. 14) and a plurality of suction-nozzle feeders 406, 412 all of which are arranged on the base 10 in an X-axis direction perpendicular to the Y-axis direction. Each of the EC feeders 404, 414 stores a plurality of ECs 32 of one sort, and the suction-nozzle feeders 406, 412 store different sorts of suction nozzles 274, 276, respectively. Each EC feeder 404, 414 has a shape like an elongate plate, and is attached to the base 10 such that both lengthwise and widthwise directions of the each EC feeder 404, 414 are horizontal. Each EC feeder 404, 414 includes a tape feeding device (not shown) which feeds a carrier tape carrying the plurality of ECs 32, at a predetermined tape-feed pitch in the Y-axis direction, and thereby positions each of the ECs 32 at an EC-supply portion 408 (FIG. 14) of the feeder 404, 414. Since the remaining portions of each EC feeder 404, 414 are the same as the corresponding portions of the EC-supply cartridge disclosed in U.S. Pat. No. 5,784,777, no description thereof or no drawings therefor are provided. Each of the suction-nozzle feeders 406, 412 has, like each EC feeder 404, 414, a shape like an elongate plate, but has a width about twice the width of each EC feeder 404, 414. Therefore, each suction-nozzle feeder 406, 412 is attached to the base 10 such that the each feeder 406, 412 fits in a groove of the base 10 over a length of the groove that is twice the length over which each EC feeder 404, 414 fits in the groove. As shown in FIG. 14, the suction-nozzle feeders 406, 412 are attached to the base 10 such that respective nozzle-supply portions 410 of the feeder 406, 412 are aligned with the respective EC-supply portions 408 of the EC feeders 404, 414, along a straight line parallel to the X-axis direction. The nozzle-supply portion 410 of each suction-nozzle feeder 406, 412 includes a nozzle-store recess (not shown) in which the suction nozzle 274, 276 is stored.

The EC holding head 30 is moved to a position above the nozzle-supply portion 410 of each suction-nozzle feeder 406, 412, and sucks and holds the suction nozzle 274, 276. Then, the nozzle 274, 276 held by the head 30 sucks and holds the EC 32 being positioned at the EC-supply portion 408 of each EC feeder 404, 414, and subsequently mounts the EC 32 on a PCB 24. In the case where it is required that the current suction nozzle 274 for taking the ECs 32 from the EC feeders 404 be changed with the different suction nozzle 276 for taking the ECs 32 from the different EC feeders 414, first, the EC holding head 30 is moved to the suction-nozzle feeder 406 so that the suction nozzle 274 is returned to the empty nozzle-store recess of the feeder 406. Subsequently, the head 30 is moved to the nozzle-suction feeder 412 to take the suction nozzle 276. The nozzle 276 held by the head 30 takes the EC 32 from the feeders 414, and mounts the ECs 32 on a PCB 24. In this embodiment, too, the suction-nozzle feeders 406, 412 store and supply the suction nozzles 274, 276 in substantially the same manners as those in which the EC feeders 404, 414 store and supply the ECs 32. In addition, the EC holding head 30 is moved to receive each suction nozzle 274, 276 in substantially the same manners in which the head 30 is moved to receive each EC 32.

The manner in which the EC feeders 404, 414 and the suction-nozzle feeders 406, 412 are arranged on the base 10 may be selected from various manners. FIG. 14 shows the manner in which the suction-nozzle feeders 406, 412 are mixed with the EC feeders 404, 414. Alternatively, it may employ the manner in which the suction-nozzle feeders 406, 412 are grouped together and the EC feeders 404, 414 are grouped together.

Figure 15:
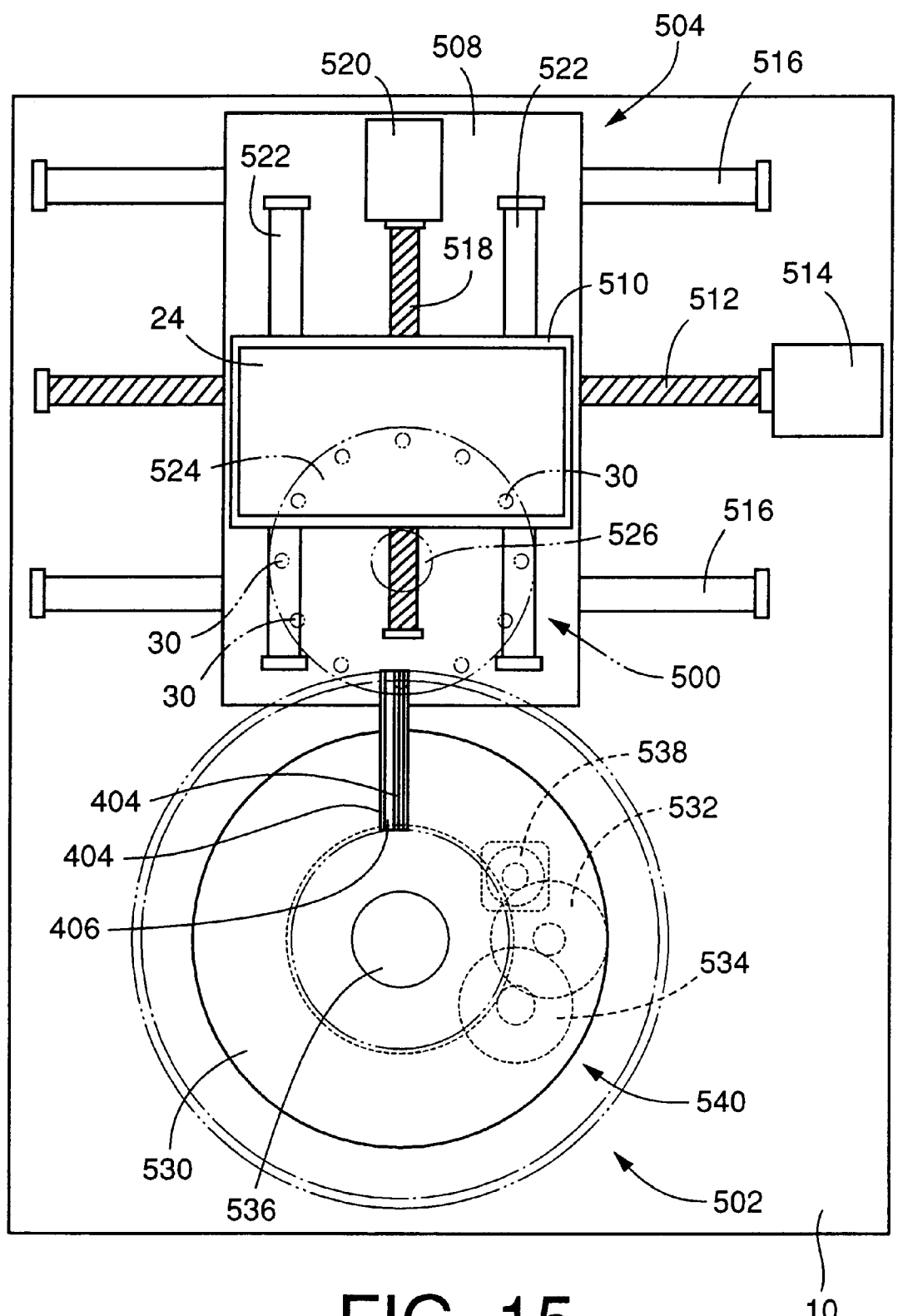
FIG. 15 is a plan view of another EC mounting system including another EC supplying system to which the present invention is applied.

FIG. 15 shows another EC mounting system which includes an EC mounting device 500, a supplying device 502, and a PCB moving device 504. The PCB moving device 504 includes an X-axis table 508 which is movable in an X-axis direction; and a Y-axis table 510 which is provided on the X-axis table 508 and which is movable in a Y-axis direction perpendicular to the X-axis direction. When a ball screw 512 is rotated by an X-axis servomotor 514, the X-axis table 508 is moved in the X-axis direction while being guided by two guide rails 516. When a ball screw 518 is rotated by a Y-axis servomotor 520, the Y-axis table 510 is moved in the Y-axis direction while being guided by two guide rails 522. Thus, a plurality of predetermined EC-mount places on a PCB 24 are sequentially positioned at an EC-mount position.

The EC mounting device 500 includes an index table 524 which is intermittently rotated about a vertical axis line at a predetermined rotation-angle pitch. The index table 524 is rotatably supported by a frame (not shown), and has a plurality of EC holding heads 30 which are spaced from each other about the vertical axis line at a predetermined spacing-angle pitch equal to the rotation-angle pitch. The index table 524 is rotated by an intermittent-rotation device including a cam and a cam follower (not shown), a rotation-axis member 526, and an index servomotor (not shown) for rotating the cam. The EC holding heads 30 are sequentially stopped at each of a supply position, an EC-posture-correct position, and an EC-mount position.

The supplying device 502 includes a rotary table 530 which is rotatable about a vertical axis line. The rotary table 530 is rotated by a table rotating device 540 which includes gears 532, 534, a rotation-axis member 536, and a rotating servomotor 538 for rotating the rotation-axis member 536. A plurality of EC feeders 404, 414 and a plurality of suction-nozzle feeders 406, 412 which have the same constructions as those of the feeders 404, 414, 406, 412 shown in FIGS. 13 and 14 are attached to the rotary table 530 such that the feeders 404, 414, 406, 412 are equiangularly spaced from one another about the rotation-axis member 536 and extend in respective radial directions as seen from the axis member 536. Respective front end portions of the feeders 404, 414, 406, 412 project radially outward from the outer circumferential edge of the rotary table 530, such that the respective EC-supply portions 408 of the EC feeders 404, 414 and the respective nozzle-supply portions 410 of the suction-nozzle feeders 406, 412 are arranged along a common circle, indicated at one-dot chain line in FIG. 15, whose center rides on the axis of rotation of the table 530. When the rotating servomotor 538 is rotated, the rotary table 530 is rotated, so that one of the EC feeders 404, 414 and the suction-nozzle feeders 466, 412 is positioned at the supply position. Then, the EC holding head 30 being positioned at the supply position is lowered by an elevating and lowering device 82, so that the head 30 takes an EC 32 or a suction nozzle 274, 276 from the EC-supply portion 408 or the nozzle-supply portion 410 of the one feeder. In the case where the head 30 takes an EC 32, the head 30 is moved to the EC-mount position where the head 30 mounts the EC 32 on the PCB 24 being positioned at the EC-mount position.

The rotary-type supplying device 502 may be replaced by a linear-type supplying device in which a plurality of EC feeders 404, 414 and a plurality of suction-nozzle feeders 406, 412 which have the same constructions as those of the feeders 404, 414, 406, 412 shown in FIGS. 13 and 14 are attached to a linearly movable table such that the feeders 404, 414, 406, 412 are arranged in the X-axis direction. The linear-type supplying device has a moving device which includes guide rails, a ball screw, and a servomotor and which linearly moves the movable table along a straight line parallel to the X-axis direction and thereby positions each of the feeders at the supply position.

The EC mounting device 500 may be replaced with a different EC mounting device including a rotary table which is rotated about a vertical axis line by a drive device and which has a plurality of EC holding units each of which supports a plurality of EC holding heads, such that the plurality of EC holding units are equiangularly spaced from each other about an axis of rotation of the table and are located along a circle whose center rides on the axis of rotation. This EC mounting device is described in detail in, e.g., Japanese Patent Application laid open for public inspection under Publication No. 4(1992)-345097. Each of the EC holding heads of each EC holding unit has a nozzle holder which holds a suction nozzle such that the nozzle extends vertically. Each EC holding unit is rotated about a vertical axis line by a head drive device, so that one of the plurality of EC holding heads is positioned (i.e. stopped) at one or more operation positions (i.e., stop positions). In the present EC mounting device, as the rotary table is intermittently rotated, the plurality of EC holding units are sequentially stopped at a supply position and an EC-mount position. One of the plurality of EC holding heads that is currently positioned at an operative position of each EC holding unit, is operated to suck a suction nozzle or an EC and mount the EC on a PCB.

Figure 16:
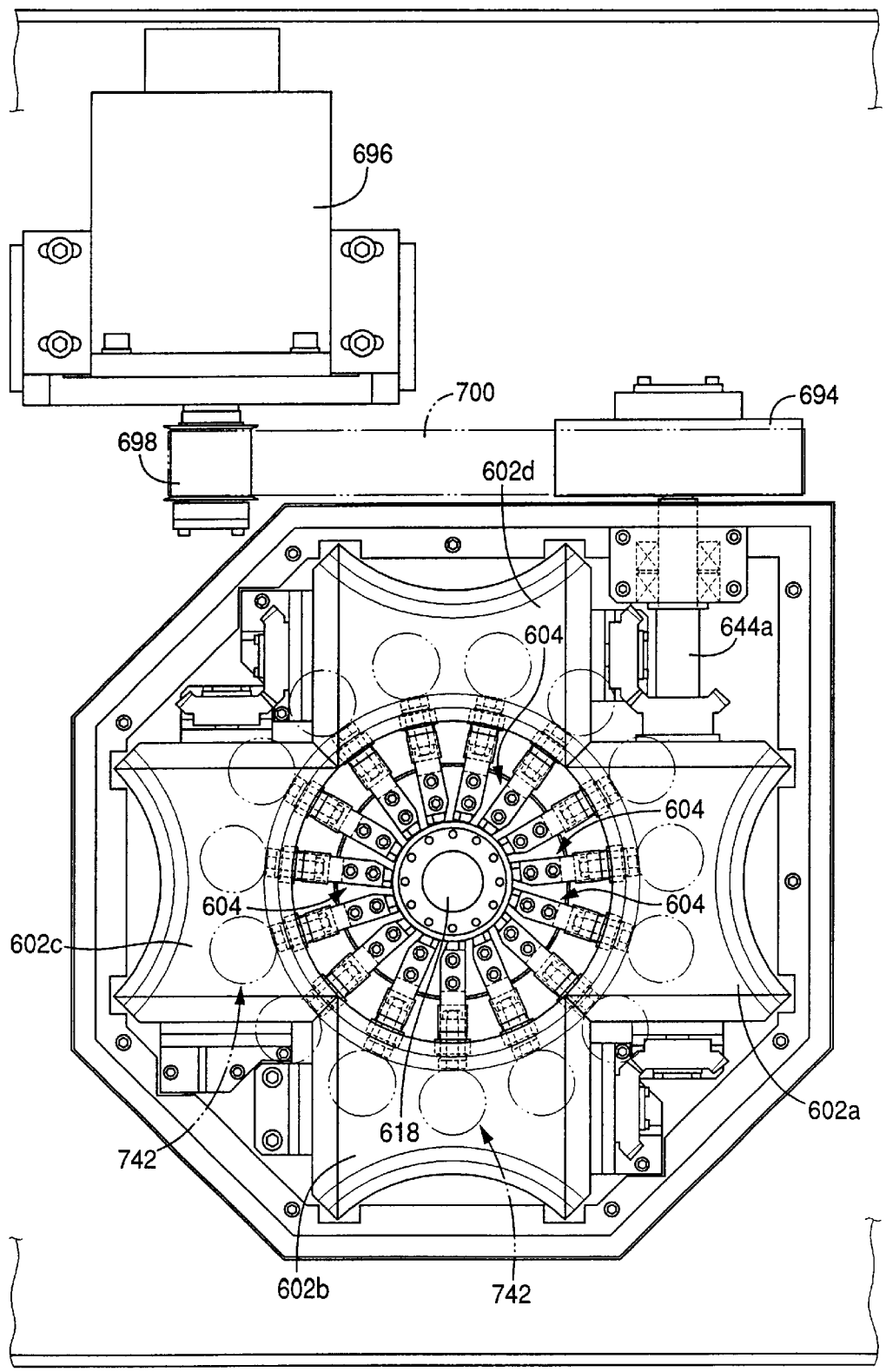
FIG. 16 is a plan view of another EC mounting system including another EC mounting device to which the present invention is applied.
Figure 17:
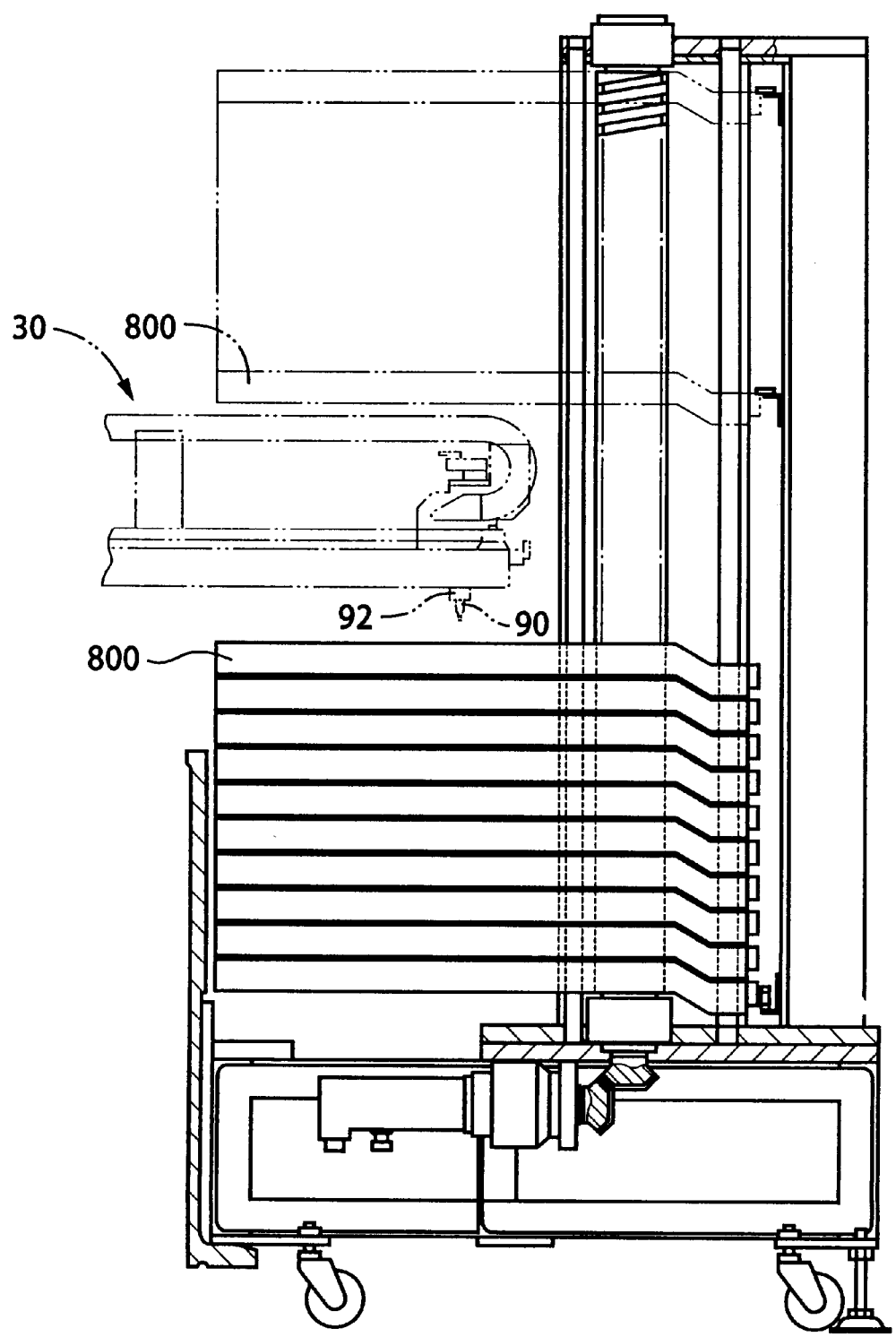
FIG. 17 is a view of another supplying device of another EC supplying system to which the present invention is applied.

The principle of the present invention is applicable to another EC mounting system including an EC mounting device shown in FIG. 16. This EC mounting device includes a plurality of EC holding heads 742; a plurality of rotary members 604 which are rotatable about a rotation-axis member 618, independent of each other, and which support the plurality of EC holding heads 742, respectively, at respective equal distances from the axis member 618; and a drive device which rotates the rotary members 604 about the axis member 618 independent of each other and stops each of the rotary members 604 at one or more predetermined stop positions including a supply position and an EC-mount position. The drive device includes four globoidal cams 602a, 602b, 602c, 602d, an axis member 644a, pulleys 694, 698, a belt 700, and a drive motor 696. Since this EC mounting device is described in detail in U.S. patent application Ser. No. 08/769,700 assigned to the Assignee of the present application, no description thereof is provided. In the present EC mounting device, as the rotary members 604 are rotated, the plurality of EC holding heads 742 are sequentially stopped at the supply position and the EC-mount position. At the supply position, each of the plurality of EC holding heads 742 is operated to suck a suction nozzle or an EC and, at the EC-mount position, each head 742 mount the EC on a PCB.

It is to be understood that one or more elements of each one of the illustrated embodiments may be combined with one or more elements of another or other embodiments. In addition, the present invention may be embodied with other changes, improvements, and modifications that may occur to those skilled in the art without departing from the scope and spirit of the invention defined in the appended claims.

What is claimed is:

1. A circuit-component supplying system comprising:

a single supplying device which stores both of a plurality of circuit components and a plurality of circuit-component holders, and which supplies both of the circuit components and the circuit-component holders;

at least one movable member to which one of the circuit-component holders is detachably attachable; and a movable-member moving device, operatively associated with the single supplying device, which moves, in a predetermined two-dimensional area which is defined by a first axis and a second axis intersecting each other and in which at least a portion of the supplying device is located, the movable member in a first direction parallel to the first axis and a second direction parallel to the second axis so that the movable member receives said one circuit-component holder from the supplying device, and which moves, in said two-dimensional area, a holding head including the movable member and said one circuit-component holder held by the movable member, in said first and second directions so that said one circuit-component holder receives one of the circuit components from the supplying device and holds said one circuit component.

2. The system according to claim 1, wherein said one circuit-component holder comprises a suction pipe which sucks and holds said one circuit component by applying a negative air pressure to said one circuit component; and an attachable portion which is detachably attachable to the movable member.

3. The system according to claim 1, wherein the supplying device comprises a plurality of trays which store each of the circuit components and the circuit-component holders at a corresponding one of a plurality of predetermined storage positions.

4. The system according to claim 3, wherein the supplying device further comprises:
   a tray accommodating member which accommodates the trays such that the trays are superposed over each other; and
   a tray moving device, operatively associated with the tray accommodating member, which selectively moves one of the trays relative to the tray accommodating member such that said one tray is positioned at a predetermined supply position in said two-dimensional area.

5. The system according to claim 4, wherein the supplying device further comprises a tray elevating and lowering device which elevates and lowers the tray accommodating member such that said one tray is positioned at a predetermined height position.

6. The system according to claim 1, wherein the supplying device comprises:
   a plurality of component feeders each of which stores a plurality of circuit components of one sort and supplies the circuit components, one by one, from a component-supply portion thereof;
   a support table which supports the component feeders such that the respective component-supply portions of the feeders are arranged along a reference line;
   a plurality of holder feeders each of which stores a plurality of circuit-component holders in a holder-store portion thereof corresponding to the respective component-supply portions of the component feeders and which are supported by the support table such that the respective holder-store portions of the holder feeders are aligned with the component-supply portions of the component feeders along the reference line; and
   a table displacing device which displaces the support table in a direction parallel to the reference line and selectively positions one of the component-supply portions of the component feeders and the holder-store portions of the holder feeders, at a predetermined supply position.

7. The system according to claim 6, wherein the support table comprises a rotatable table which is rotatable about an axis line intersecting a horizontal plane, and wherein the table displacing device comprises a table rotating device which rotates the rotatable table about the axis line.

8. The system according to claim 6, wherein the support table comprises a linearly movable table which is linearly movable along a horizontal, straight line, and wherein the table displacing device comprises a linearly moving device which linearly moves the linearly movable table along the straight line.

9. A circuit-component mounting system comprising:
   a circuit-component supplying system including: a single supplying device which stores both of a plurality of circuit components and a plurality of circuit-component holders, and which supplies both of the circuit components and the circuit-component holders; at least one movable member to which one of the circuit-component holders is detachably attachable; and a movable-member moving device, operatively associated with the single supplying device, which moves, in a predetermined two-dimensional area which is defined by a first axis and a second axis intersecting each other and in which at least a portion of the supplying device is located, the movable member in a first direction parallel to the first axis and a second direction parallel to the second axis so that the movable member receives said one circuit-component holder from the supplying device, and which moves, in said two-dimensional area, a holding head including the movable member and said one circuit-component holder held by the movable member, in said first and second directions so that said one circuit-component holder receives one of the circuit components from the supplying device and holds said one circuit component; and
   a circuit-substrate holding device which holds a circuit substrate on which the circuit components are to be mounted,
   the movable-member moving device moving, in said two-dimensional area in which the circuit substrate held by the circuit-substrate holding device is located, the holding head including the movable member and said one circuit-component holder in said first and second directions so that said one circuit-component holder mounts said one circuit component received from the supplying device, on the circuit substrate held by the circuit-substrate holding device.

10. The system according to claim 9, wherein the movable-member moving device comprises an X-Y robot which moves the movable member to an arbitrary position on a substantially horizontal plane.

11. The system according to claim 9, wherein the movable-member moving device comprises a rotating device which rotates the movable member about an axis line intersecting a horizontal plane, and stops the movable member at at least one predetermined stop position.

12. The system according to claim 11, wherein the system comprises a plurality of movable members as said at least one movable member, and wherein the rotating device comprises:
   a plurality of rotary members which are rotatable about the axis line, independent of each other, and which support the plurality of movable members, respectively, at respective equal distances from the axis line; and
   a drive device which rotates the rotary members about the axis line independent of each other and stops each of the rotary members at the predetermined stop position.

13. The system according to claim 11, wherein the system comprises a plurality of movable members as said at least one movable member, and wherein the rotating device comprises:
   a rotatable body which is rotatable about the axis line and which supports the plurality of movable members such that the movable members are located on a circle whose center rides on the axis line, and are angularly spaced from each other about the axis line at a predetermined angular pitch; and a drive device which intermittently rotates the rotatable body at the predetermined angular pitch and thereby stops the movable members, one by one, at the predetermined stop position.

14. The system according to claim 9, wherein the circuit-substrate holding device comprises a circuit-substrate moving device which moves the circuit substrate in an X-axis direction and a Y-axis direction perpendicular to the X-axis direction in a substantially horizontal plane, and positions a certain portion of the circuit substrate at a predetermined component-mount position.

15. A circuit-component supplying system comprising:

at least one first tray which stores a plurality of circuit components at a plurality of first predetermined storage positions, respectively;

at least one second tray which stores a plurality of circuit-component holders at a plurality of second predetermined storage positions, respectively;

a tray accommodating member which accommodates the first and second trays such that the first and second trays are superposed over each other;

a tray moving device, operatively associated with the tray accommodating member, which selectively moves each of the first and second trays relative to the tray accommodating member such that said each tray is positioned at a predetermined supply position;

a tray elevating and lowering device, operatively associated with the tray accommodating member, which elevates and lowers the tray accommodating member such that said each tray is positioned at a predetermined height position;

at least one movable member to which one of the circuit-component holders is detachably attachable; and a movable-member moving device, operatively associated with the tray accommodating member, which moves, in a predetermined two-dimensional area which is defined by a first axis and a second axis intersecting each other and in which the predetermined supply position is located, the movable member in a first direction parallel to the first axis and a second direction parallel to the second axis so that the movable member receives said one circuit-component holder from the second tray positioned at the predetermined supply position and the predetermined height position, and which moves, in said two-dimensional area, a holding head including the movable member and said one circuit-component holder held by the movable member, in said first and second directions so that said one circuit-component holder receives one of the circuit components from the first tray positioned at the predetermined supply position and the predetermined height position and holds said one circuit component.

16. A circuit-component supplying system comprising:

a plurality of trays each of which stores a plurality of circuit components at a plurality of first predetermined storage positions, respectively, and at least one of which stores, in addition to the circuit components, a plurality of circuit-component holders at a plurality of second predetermined storage positions, respectively;

a tray accommodating member which accommodates the tray such that the trays are superposed over each other;

a tray moving device, operatively associated with the tray accommodating member, which selectively moves said each of the trays relative to the tray accommodating member such that said each tray is positioned at a predetermined supply position;

a tray elevating and lowering device, operatively associated with the tray accommodating member, which elevates and lowers the tray accommodating member such that said each tray is positioned at a predetermined height position;

at least one movable member to which one of the circuit-component holders is detachably attachable; and a movable-member moving device, operatively associated with the tray accommodating member, which moves, in a predetermined two-dimensional area which is defined by a first axis and a second axis intersecting each other and in which the predetermined supply position is located, the movable member in a first direction parallel to the first axis and a second direction parallel to the second axis so that the movable member receives said one circuit-component holder from said at least one tray positioned at the predetermined supply position and the predetermined height position, and which moves, in said two-dimensional area, a holding head including the movable member and said one circuit-component holder held by the movable member, in said first and second directions so that said one circuit-component holder receives one of the circuit components from said each tray positioned at the predetermined supply position and the predetermined height position and holds said one circuit component.

17. A circuit-component supplying system comprising:

a plurality of trays which store a plurality of circuit components at a plurality of first predetermined storage positions, respectively, and store a plurality of circuit-component holders at a plurality of second predetermined storage positions, respectively;

a tray accommodating member which accommodates the trays such that the trays are superposed over each other;

at least one movable member to which one of the circuit-component holders is detachably attachable; and a movable-member moving device, operatively associated with the tray accommodating member, which moves, in a predetermined two-dimensional area which is defined by a first axis and a second axis intersecting each other and in which at least a portion of each of the trays is located, the movable member in a first direction parallel to the first axis and a second direction parallel to the second axis so that the movable member enters a first space secured between a first pair of trays and receives said one circuit-component holder from one of the first pair of trays, and which moves, in said two-dimensional area, a holding head including the movable member and said one circuit-component holder held by the movable member, in said first and second directions so that said one circuit-component holder enters a second space secured between a second pair of trays and receives one of the circuit components from one of the second pair of trays and holds said one circuit component.

18. The system according to claim 17, wherein the plurality of trays comprises:

at least one first tray which stores the plurality of circuit components at the plurality of first predetermined storage positions, respectively; and at least one second tray which stores the plurality of circuit-component holders at the plurality of second predetermined storage positions, respectively.

* * * * *